(12) United States Patent
Chidambarrao et al.

(10) Patent No.: US 7,943,493 B2
(45) Date of Patent: May 17, 2011

(54) ELECTRICAL FUSE HAVING A FULLY SILICIDED FUSELINK AND ENHANCED FLUX DIVERGENCE

(75) Inventors: Dureseti Chidambarrao, Weston, CT (US); William K. Henson, Beacon, NY (US); Deok-Kee Kim, Bedford Hills, NY (US); Chandrasekharan Kothandaraman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/873,882

(22) Filed: Sep. 1, 2010

(65) Prior Publication Data

US 2010/0330783 A1  Dec. 30, 2010

Related U.S. Application Data

(62) Division of application No. 11/925,164, filed on Oct. 26, 2007, now Pat. No. 7,838,963.

(51) Int. Cl.
    *H01L 21/20* (2006.01)
(52) U.S. Cl. ............ 438/479; 438/128; 257/E21.119
(58) Field of Classification Search ............ 438/479, 438/128, 510, 597, 132, 592; 257/E21.119, 257/E21.536
    See application file for complete search history.

(56) References Cited

U.S. PATENT DOCUMENTS

| 4,679,310 | A | 7/1987 | Ramachandra et al. |
| 5,365,105 | A | 11/1994 | Liu et al. |
| 5,955,275 | A | 9/1999 | Kamb |
| 5,969,404 | A | 10/1999 | Bohr et al. |
| 6,204,132 | B1 | 3/2001 | Kittl et al. |
| 6,274,440 | B1 | 8/2001 | Arndt et al. |
| 6,326,289 | B1 | 12/2001 | Rodder et al. |
| 6,384,664 | B1 | 5/2002 | Hellums et al. |
| 6,507,087 | B1 | 1/2003 | Yu |
| 6,642,601 | B2 | 11/2003 | Marshall et al. |
| 6,661,330 | B1 | 12/2003 | Young |
| 6,958,523 | B2 | 10/2005 | Babcock et al. |
| 6,982,610 | B2 | 1/2006 | Govind |
| 6,984,550 | B2 | 1/2006 | Yamazaki et al. |
| 7,491,585 | B2 | 2/2009 | Yang et al. |
| 7,550,323 | B2 | 6/2009 | Chidambarrao et al. |
| 2003/0160297 | A1 | 8/2003 | Kathandaraman et al. |
| 2008/0308900 | A1* | 12/2008 | Kim et al. ............ 257/529 |
| 2009/0040006 | A1 | 2/2009 | Chidambarrao et al. |
| 2009/0042341 | A1* | 2/2009 | Chidambarrao et al. ..... 438/132 |
| 2009/0051002 | A1 | 2/2009 | Booth et al. |
| 2009/0101989 | A1* | 4/2009 | Chen et al. ............ 257/379 |

* cited by examiner

*Primary Examiner* — Thomas L Dickey
*Assistant Examiner* — Fazli Erdem
(74) *Attorney, Agent, or Firm* — Scully, Scott, Murphy & Presser, P.C.; Joseph P. Abate, Esq.

(57) ABSTRACT

A contiguous block of a stack of two heterogeneous semiconductor layers is formed over an insulator region such as shallow trench isolation. A portion of the contiguous block is exposed to an etch, while another portion is masked during the etch. The etch removes an upper semiconductor layer selective to a lower semiconductor layer in the exposed portion. The etch mask is removed and the entirety of the lower semiconductor layer within the exposed region is metallized. A first metal semiconductor alloy vertically abutting the insulator region is formed, while exposed surfaces of the stack of two heterogeneous semiconductor layers, which comprises the materials of the upper semiconductor layer, are concurrently metallized to form a second metal semiconductor alloy. An inflection point for current and, consequently, a region of flux divergence are formed at the boundary of the two metal semiconductor alloys.

9 Claims, 34 Drawing Sheets

ELECTRICAL FUSE HAVING A FULLY SILICIDED FUSELINK AND ENHANCED FLUX DIVERGENCE

CROSS REFERENCE TO RELATED APPLICATION

This application is a divisional of U.S. patent application Ser. No. 11/925,164, filed Oct. 26, 2007 the entire content and disclosure of which is incorporated herein by reference.

FIELD OF THE INVENTION

The present invention relates to semiconductor structures, and particularly to an electrical fuse having a fully silicided fuselink and providing vertical flux divergence at a junction of a fully silicide region and a partially silicided region, and methods of manufacturing the same.

BACKGROUND OF THE INVENTION

Electrical fuses (eFuses) are used in the semiconductor industry to implement array redundancy, field programmable arrays, analog component trimming circuits, and chip identification circuits. Once programmed, the programmed state of an electrical fuse does not revert to the original state on its own, that is, the programmed state of the fuse is not reversible. For this reason, electrical fuses are called One-Time-Programmable (OTP) memory elements.

The mechanism for programming an electrical fuse is electromigration of a metal semiconductor alloy induced by an applied electrical field and an elevated temperature on a portion of the electrical fuse structure. The metal semiconductor alloy is electromigrated under these conditions from the portion of the electrical fuse structure, thereby increasing the resistance of the electrical fuse structure. The rate and extent of electromigration during programming of an electrical fuse is dependent on the temperature and the current density at the electromigrated portion.

An electrical fuse typically comprises an anode, a cathode, and a fuselink. The fuselink is a narrow strip of a conductive material adjoining the anode and cathode. During programming of the electrical fuse, a positive voltage bias is applied to the anode and a negative voltage bias is applied to the cathode. As electrical current flows through the fuselink having a narrow cross-sectional area, the temperature of the fuselink is elevated. A high current density combined with the elevated temperature at the fuselink facilitates electromigration of the conductive material, which may comprise a metal silicide.

A typical prior art electrical fuse employs a stack of a gate dielectric, a polysilicon layer, and a metal silicide layer. Under electrical bias through the electrical fuse, the metal silicide layer provides an initial current path since a typical metal silicide material has a conductivity at least one order of magnitude greater than the conductivity of even the most heavily doped polysilicon material. As the metal silicide material electromigrates, the electrical current path formed by the initial metal silicide layer is broken. Further, the high temperature that the metal silicide layer generated prior to completion of electromigration contributes to dopant electromigration in the polysilicon layer underneath, causing depletion of the dopants in the polysilicon layer in a programmed prior art electrical fuse. A programmed electrical fuse attains a high enough resistance so that a sensing circuit may detect the programmed electrical fuse as such. Thus, the prior art electrical fuse containing a vertically abutting stack of the gate dielectric, the polysilicon layer, and the metal silicide layer provides an OTP memory element without introducing any additional mask level or any extra processing steps.

Despite the general improvement in the distribution of post-programming resistance of electrical fuses through the use of electromigration mode programming, not all fuses produce a post-programming resistance distribution with high resistance values even in an electromigration mode. The distribution of the resistance of programmed fuses is also dependent on the design of fuses as well; some producing more low resistance values for programmed fuses, while some others produce less low resistance values.

In view of the above, there exists a need for an electrical fuse structure providing good programming characteristics including high post-programming resistance, and methods of manufacturing the same.

SUMMARY OF THE INVENTION

The present invention addresses the needs described above by providing an electrical fuse containing a first metal semiconductor alloy located at least in a portion of a fuselink and directly on shallow trench isolation, and a second metal semiconductor alloy located on a sidewall of a heterogeneous stack of two semiconductor layers and adjoined to the first metal semiconductor alloy to provide flux divergence, and methods of manufacturing the same.

A contiguous block of a stack of two heterogeneous semiconductor layers is formed over an insulator region such as shallow trench isolation, followed by optional formation of a dielectric spacer. The contiguous block is lithographically patterned to provide an etch mask such that a portion of the contiguous block is exposed to an etch, while another portion is masked during the etch. The etch removes an upper semiconductor layer selective to a lower semiconductor layer in the exposed portion. The etch mask is removed and the entirety of the lower semiconductor layer within the exposed region is metallized. A first metal semiconductor alloy vertically abutting the insulator region is formed, while exposed surfaces of the stack of two heterogeneous semiconductor layers, which comprises the materials of the upper semiconductor layer, are concurrently metallized to form a second metal semiconductor alloy. An inflection point for current and, consequently, a region of flux divergence, are formed at the boundary of the two metal semiconductor alloys.

According to an aspect of the present invention, a semiconductor structure is provided, which comprises:

a first metal semiconductor alloy portion comprising an alloy of a first semiconductor material and a metal and vertically abutting an insulator region in a substrate;

a first semiconductor portion comprising the first semiconductor material and vertically abutting the insulator region and laterally abutting the first metal semiconductor alloy;

a second semiconductor portion comprising a second semiconductor material and vertically abutting the first semiconductor portion, wherein the second semiconductor material is different from the first semiconductor material; and a second metal semiconductor alloy portion comprising an alloy of the second semiconductor material and the metal and abutting the first metal semiconductor alloy portion and the second semiconductor portion.

In one embodiment, the second metal semiconductor alloy portion is disjoined from the insulator region and is located on a sidewall of the second semiconductor portion. The second metal semiconductor alloy portion may extend over a top surface of the second semiconductor portion.

In another embodiment, the first semiconductor portion and the second semiconductor portion have vertically coincident sidewalls and collectively constitute a first semiconductor stack. The semiconductor structure may further comprise a dielectric spacer laterally abutting the vertically coincident sidewalls and another sidewall of the first metal semiconductor alloy portion.

In even another embodiment, the first metal semiconductor alloy portion has a first width, wherein the first semiconductor stack comprises a narrow region having a second width and a wide region having a third width, wherein the narrow region laterally abuts the first metal semiconductor alloy portion, wherein the first width is the same as the second width and is less than the third width, and wherein the first width, the second width, and the third width are measured in a direction parallel to an interface between the first metal semiconductor alloy portion and the first semiconductor portion.

In yet another embodiment, the first metal semiconductor alloy portion comprises a narrow region having a first width and a wide region having a second width, wherein the first semiconductor stack has a third width, wherein the wide region laterally abuts the first semiconductor stack, wherein the second width is greater than the first width and is equal to the third width, and wherein the first width, the second width, and the third width are measured in a direction parallel to an interface between the first metal semiconductor alloy portion and the first semiconductor portion.

In still another embodiment, the first metal semiconductor alloy portion has a first width, wherein the first semiconductor stack has a second width, wherein the first width is substantially the same as the second width, and wherein the first width and the second width are measured in a direction parallel to an interface between the first metal semiconductor alloy portion and the first semiconductor portion.

In still yet another embodiment, the semiconductor structure comprises a set of at least one metal contact via located directly on the second metal semiconductor alloy portion.

In a further embodiment, the semiconductor structure further comprises a set of at least one metal contact via located directly on the first metal semiconductor alloy portion.

In an even further embodiment, the semiconductor structure further comprises:
a third semiconductor portion comprising the first semiconductor material and vertically abutting the insulator region and laterally abutting the first metal semiconductor alloy and disjoined from the first semiconductor portion;
a fourth semiconductor portion comprising the second semiconductor material and vertically abutting the third semiconductor portion; and
a third metal semiconductor alloy portion comprising the alloy of the second semiconductor material and the metal and abutting the first metal semiconductor alloy portion and the fourth semiconductor portion.

In a yet further embodiment, the third metal semiconductor alloy portion is disjoined from the insulator region and the second metal semiconductor alloy portion and is located on a sidewall of the fourth semiconductor portion.

In a still further embodiment, the third metal semiconductor alloy portion extends over a top surface of the fourth semiconductor portion.

In a still yet further embodiment, the first semiconductor portion and the second semiconductor portion have a first set of vertically coincident sidewalls and collectively constitute a first semiconductor stack, and wherein the third semiconductor portion and the fourth semiconductor portion have a second set of vertically coincident sidewalls and collectively constitute a third semiconductor stack.

In further another embodiment, the first metal semiconductor alloy portion has a first width, wherein the second semiconductor stack comprises a narrow region having a fourth width and a wide region having a fifth width, wherein the narrow region laterally abuts the first metal semiconductor alloy portion, wherein the first width is the same as the fourth width and is less than the fifth width, and wherein the first width, the fourth width, and the fifth width are measured in a direction parallel to an interface between the first metal semiconductor alloy portion and the third semiconductor portion.

In even further another embodiment, the first metal semiconductor alloy portion comprises a narrow region having a first width and a wide region having a fourth width, wherein the second semiconductor stack has a fifth width, wherein the wide region laterally abuts the second semiconductor stack, wherein the fourth width is greater than the first width and is equal to the fifth width, and wherein the first width, the fourth width, and the fifth width are measured in a direction parallel to an interface between the first metal semiconductor alloy portion and the third semiconductor portion.

In yet further another embodiment, the first metal semiconductor alloy portion has a first width, wherein the second semiconductor stack has a fourth width, wherein the first width is the substantially the same as the fourth width, and wherein the first width and the fourth width are measured in a direction parallel to an interface between the first metal semiconductor alloy portion and the second semiconductor portion.

In still further another embodiment, the semiconductor structure further comprises:
a first set of at least one metal contact via located directly on the second metal semiconductor alloy portion; and
a second set of at least one metal contact via located directly on the third metal semiconductor alloy portion.

In still further another embodiment, the first semiconductor material comprises silicon and the second semiconductor material comprises a silicon germanium alloy.

According to another aspect of the present invention, a method of forming a semiconductor structure is provided, which comprises:
forming a first semiconductor layer comprising a first semiconductor material on an insulator region in a substrate;
forming a second semiconductor layer comprising a second semiconductor material directly on the first semiconductor layer, wherein the second semiconductor material is different from the first semiconductor material;
patterning a contiguous block of containing the first semiconductor layer and the second semiconductor layer;
masking a stack of a first semiconductor portion and a second semiconductor portion, wherein the first semiconductor portion is a portion of the first semiconductor layer and the second semiconductor portion is a portion of the second semiconductor layer, while exposing another portion of the second semiconductor layer;
etching the another portion of the second semiconductor layer to expose a top surface of another portion of the first semiconductor layer, while protecting the stack;
fully metallizing the another portion of the first semiconductor layer to form a first metal semiconductor alloy portion and partially metallizing the second semiconductor portion to form a second metal semiconductor alloy portion, wherein the second metal semiconductor alloy region abuts the first metal semiconductor alloy portion and the second semiconductor portion.

In one embodiment, the method further comprises forming a dielectric spacer laterally abutting the contiguous block prior to the masking of the masking of the stack of the first semiconductor portion and the second semiconductor portion.

In another embodiment, the first metal semiconductor portion abuts the insulator region, and wherein the second metal semiconductor alloy portion is disjoined from the insulator region and is located on a sidewall of the second semiconductor portion.

In even another embodiment, the second metal semiconductor alloy portion extends over a top surface of the second semiconductor portion, and wherein the first semiconductor portion and the second semiconductor portion have vertically coincident sidewalls and collectively constitute a first semiconductor stack.

In yet another embodiment, the method further comprises:

masking another stack of a third semiconductor portion and a fourth semiconductor portion concurrently with the masking of the stack, wherein the third semiconductor portion is a portion of the first semiconductor layer and the fourth semiconductor portion is a portion of the second semiconductor layer;

protecting the another stack concurrently with the protecting of the stack; and partially metallizing the fourth semiconductor portion to form a third metal semiconductor alloy portion concurrently with the fully metallizing of the another portion of the first semiconductor layer, wherein the third metal semiconductor alloy region abuts the first metal semiconductor alloy portion and the fourth semiconductor portion.

In still another embodiment, the first semiconductor portion and the second semiconductor portion have a first set of vertically coincident sidewalls and collectively constitute a first semiconductor stack, and wherein the third semiconductor portion and the fourth semiconductor portion have a second set of vertically coincident sidewalls and collectively constitute a second semiconductor stack.

In still yet another embodiment, the method further comprises:

forming a first set of at least one metal contact via directly on the second metal semiconductor alloy portion; and forming a second set of at least one metal contact via directly on the third metal semiconductor alloy portion.

BRIEF DESCRIPTION OF THE DRAWINGS

FIGS. 7A-17A with the suffix "A" are top-down views of second through twelfth exemplary structures, respectively, according to second through eleventh embodiments of the present invention.

FIGS. 7B-17B with the suffix "B" are vertical cross-sectional views of the second through twelfth exemplary structures, respectively, according to the second through twelfth embodiments of the present invention. Figures with the same numeric label correspond to the same embodiment.

DETAILED DESCRIPTION OF THE INVENTION

Figure 1A:
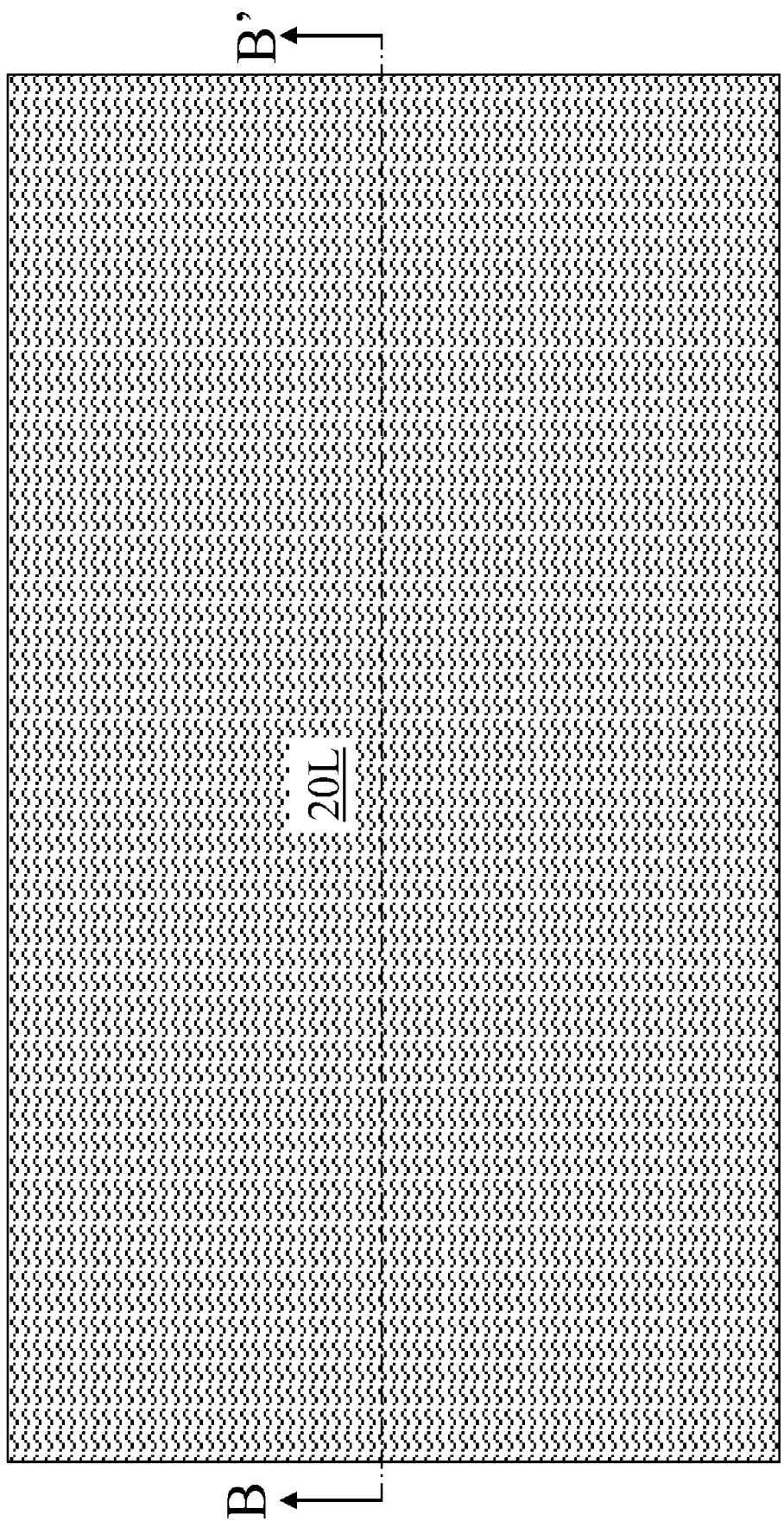
FIGS. 1A-6B are sequential views of a first exemplary semiconductor structure at various stages of a manufacturing process according to a first embodiment of the present invention. Figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A."

As stated above, the present invention relates to an electrical fuse having a fully silicided fuselink and providing vertical flux divergence at a junction of a fully silicide region and a partially silicided region, and methods of manufacturing the same, which are now described in detail with accompanying figures. It is noted that like and corresponding elements mentioned herein and illustrated in the drawings are referred to by like reference numerals.

Figure 1B:
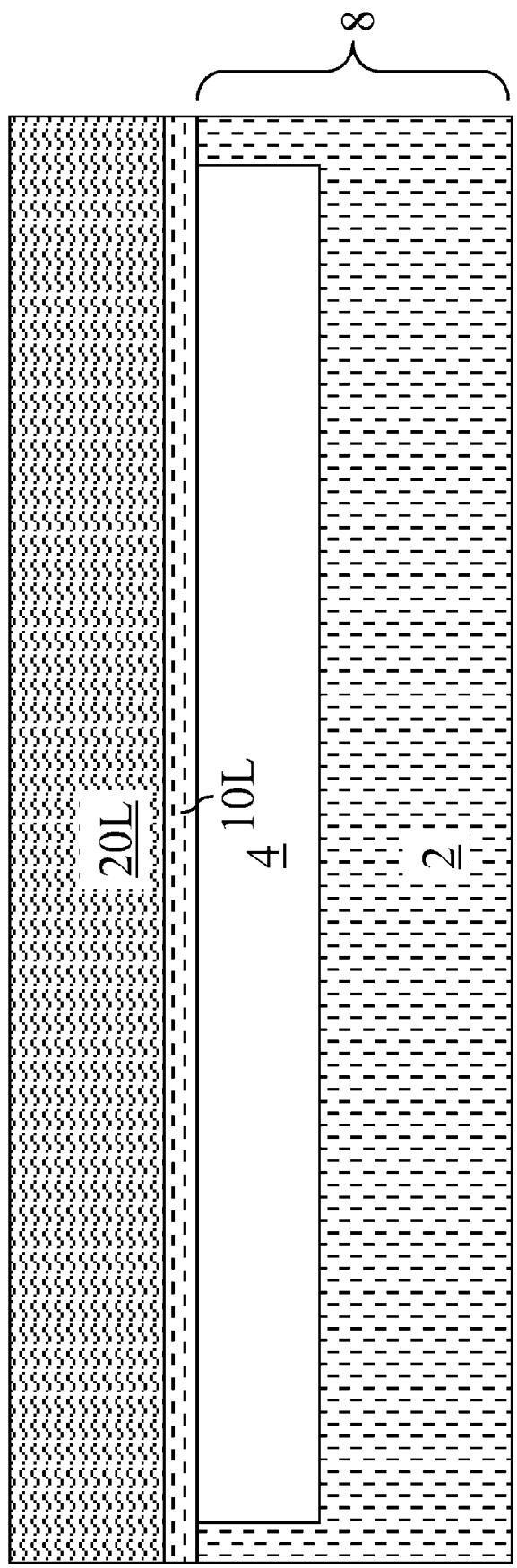

Referring to FIGS. 1A-1B, a first exemplary semiconductor structure according to the present invention is shown. FIG. 1A is a top-down view. FIG. 1B is a vertical cross-sectional view along the plane B-B' shown in FIG. 1A.

The first exemplary semiconductor structure comprises a substrate 8 that contains a semiconductor layer 2 and an insulator region 4. The substrate 8 may be a bulk semiconductor substrate, a semiconductor-on-insulator (SOI) substrate, or a hybrid semiconductor substrate having a bulk portion and an SOI portion. Alternatively, instead of the semiconductor layer 2, the substrate 8 may comprise an insulator substrate (not shown) or a metallic substrate (not shown) containing an insulator region on a top surface thereof.

The semiconductor layer 2 comprises a semiconductor material such as silicon, a silicon containing alloy, a germanium containing alloy, a III-V compound semiconductor, or a II-IV semiconductor. Preferably, the semiconductor layer 2 is single crystalline. The insulator region 8 comprises a dielectric material such as silicon oxide, silicon nitride, an insulating metal oxide, or an insulating metal nitride. The insulator region 8 may comprise a shallow trench isolation structure that provides electrical isolation between semiconductor devices (not shown) to be subsequently formed on the semiconductor layer 2. Optionally, a dielectric layer (not shown), such as a gate dielectric layer comprising a thermally formed dielectric material or a high dielectric constant (k>3.9) gate dielectric material, may be formed on a top surface of the semiconductor layer 2.

A stack of a first semiconductor layer 10L comprising a first semiconductor material and a second semiconductor layer 20L comprising a second semiconductor material is formed on a top surface of the substrate 8. The first semiconductor material and the second semiconductor material are different. The pair of first semiconductor material and the second semiconductor material is selected such that the second semiconductor material may be etched with a high selectivity to the first semiconductor material in an anisotropic etch, such as a reactive ion etch. For example, the first semiconductor material may comprise silicon and the second semiconductor material may comprise a silicon germanium alloy with a germanium concentration of about 1 to about 20% in atomic concentration. Other combinations for the pair of the first semiconductor material and the second semiconductor material may be employed to practice the present invention as long as a suitable etch chemistry is provided to enable an etch that selectively removes the second semiconductor material relative to the first semiconductor material.

The first semiconductor layer 10L may have a polycrystalline, microcrystalline, or amorphous structure. The first semiconductor material may be one of silicon, a silicon containing alloy, a germanium containing alloy, a III-V compound semiconductor, or a II-IV semiconductor. The first semiconductor layer may be doped with at least one electrical dopant such as boron, gallium, indium, phosphorus, arsenic, antimony, or a combination thereof. The first semiconductor layer 10L may be formed by chemical vapor deposition (CVD) employing a precursor containing the first semiconductor material. Low pressure chemical vapor deposition (LPCVD), rapid thermal chemical vapor deposition (RTCVD), plasma enhanced chemical vapor deposition (PECVD), or alternating layer deposition (ALD) may be employed. In case the first semiconductor material comprises polysilicon, the precursor may comprise silane, disilane, dichlorosilane, trichlorosilane, a silicon containing organic precursor, or a combination thereof. The thickness of the first semiconductor layer 10L is selected to enable full metallization of the first semiconductor layer 10L during a metallization step. In other words, the thickness of the first semiconductor layer 10L is selected such that a metal layer interacting with the first semiconductor layer consumes all of the first semiconductor layer 10L and the resulting metal semiconductor alloy directly contacts the insulator region 4. Thus, the thickness of the first semiconductor layer 10L is from about 5 nm to about 30 nm, and preferably from about 10 nm to about 20 nm, although lesser and greater thicknesses for the first semiconductor layer 10 are explicitly contemplated herein.

The second semiconductor layer 20L may have a polycrystalline, microcrystalline, or amorphous structure. The second semiconductor material may be one of silicon, a silicon containing alloy, a germanium containing alloy, a III-V compound semiconductor, or a II-IV semiconductor. The first semiconductor layer may be doped with at least one electrical dopant such as boron, gallium, indium, phosphorus, arsenic, antimony, or a combination thereof. The second semiconductor layer 20L may be formed by chemical vapor deposition (CVD) employing a precursor containing the second semiconductor material in a similar manner to formation of the first semiconductor layer 10L. In case the second semiconductor material comprises a silicon germanium alloy, the precursor may comprise a mixture of a first reactant and a second reactant, in which the first reactant comprises silane, disilane, dichlorosilane, trichlorosilane, a silicon containing organic precursor, or a combination thereof and the second reactant comprises germane, digermane, dichlorogermane, trichlorogermane, a germanium containing organic precursor, or a combination thereof. The thickness of the second semiconductor layer 20L may be from about 30 nm to about 270 nm, and preferably from about 50 nm to about 170 nm, and more preferably from about 70 nm to about 120 nm, although lesser and greater thicknesses for the second semiconductor layer 20 are explicitly contemplated herein.

Figure 2A:
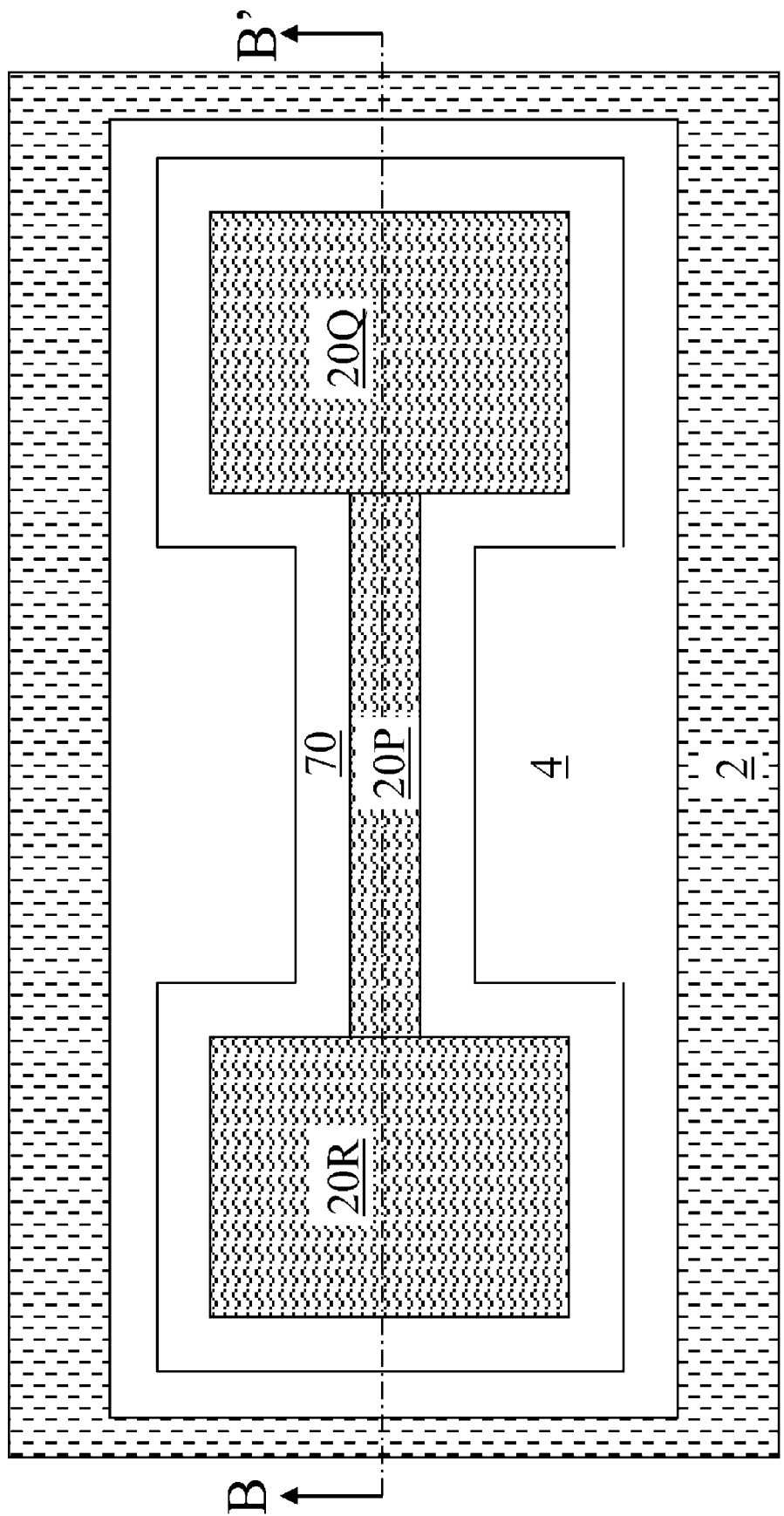
Figure 2B:
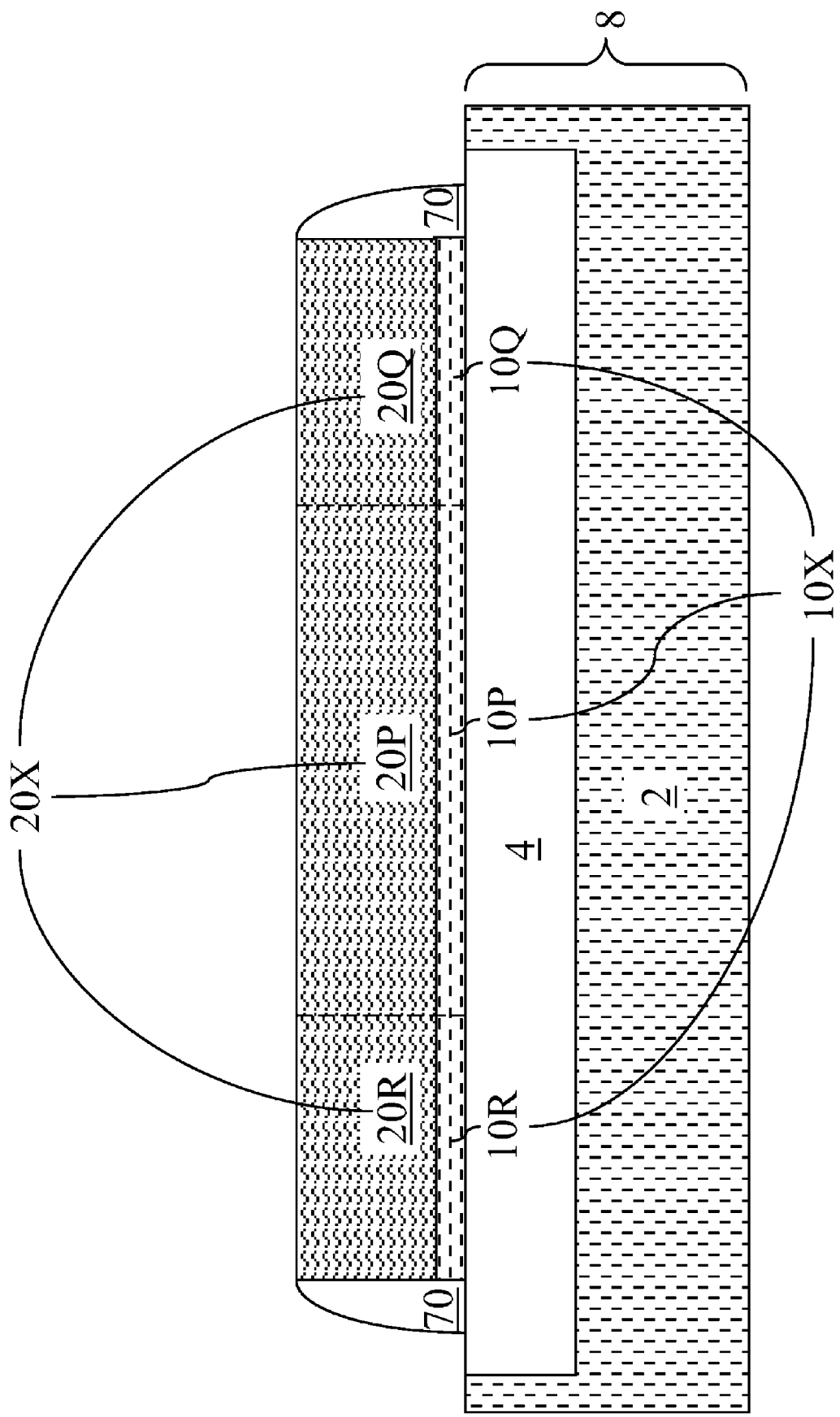

Referring to FIGS. 2A-2B, the stack of the first semiconductor layer 10L and the second semiconductor layer 20L is patterned by lithographic methods and etching. Specifically, a first photoresist (not shown) is applied over the surface of the second semiconductor layer 20 and lithographically patterned to form a contiguous shape, followed by a transfer of the pattern of the block into the stack of the first semiconductor layer 10L and the second semiconductor layer 20L by an anisotropic etch such as a reactive ion etch. The remaining portion of the first semiconductor layer 10L comprises a first semiconductor material block 10X, and the remaining portion of the second semiconductor layer comprises a second semiconductor material block 20X. The first semiconductor material block 10X and the second semiconductor material block 20X have vertically coincident sidewalls, i.e., have vertical sidewalls that have coinciding boundaries in a top-down view of FIG. 2A.

The first semiconductor material block 10X comprises a primary first semiconductor material sub-portion 10P, a secondary first semiconductor material sub-portion 10Q, and a tertiary first semiconductor material sub-portion 10R. The primary first semiconductor material sub-portion 10P may have a rectangular horizontal cross-sectional shape and a widthwise edge, i.e., an edge having a smaller dimension than another adjoining edge in the horizontal cross-sectional shape, may laterally abut an edge of the secondary first semiconductor material sub-portion 10R. Another widthwise edge of the primary first semiconductor material sub-portion 10P may laterally abut the tertiary first semiconductor material sub-portion 10R. A width along the widthwise direction of the primary first semiconductor material sub-portion 10P may be less than a width of the secondary first semiconductor material sub-portion 10Q and a width of the tertiary first semiconductor material sub-portion 10R. Each of the secondary first semiconductor material sub-portion 10Q and the tertiary first semiconductor material sub-portion 10R may have a substantially rectangular horizontal cross-sectional shape. As will be shown below, relationships between the widths of the various first semiconductor material sub-portions (10P, 10Q, 10R) may be changed in various embodiments of the present invention. Preferably, the width along the widthwise direction of the primary first semiconductor material sub-portion 10P may be a lithographic minimum dimension, which is the minimum dimension that may be printed by a lithographic tool of a given generation. As of 2007, the lithographic minimum dimension is considered to be about 45 nm.

Similarly, the second semiconductor material block 20X comprises a primary second semiconductor material sub-portion 20P, a secondary second semiconductor material sub-portion 20Q, and a tertiary second semiconductor material sub-portion 20R. The second semiconductor material block 20X has a substantially the same horizontal cross-sectional shape as the first semiconductor material block 10X. Thus, the primary second semiconductor material sub-portion 20P may have a rectangular horizontal cross-sectional shape and a widthwise edge, i.e., an edge having a smaller dimension than another adjoining edge in the horizontal cross-sectional shape, may laterally abut an edge of the secondary second semiconductor material sub-portion 20R. Another widthwise edge of the primary second semiconductor material sub-portion 20P may laterally abut the tertiary second semiconductor material sub-portion 20R. A width along the widthwise direction of the primary second semiconductor material sub-portion 20P may be less than a width of the secondary second semiconductor material sub-portion 20Q and a width of the tertiary second semiconductor material sub-portion 20R. Relationships between the widths of the various second semiconductor material sub-portions (20P, 20Q, 20R) varies according to the relationships between the widths of the various first semiconductor material sub-portions (10P, 10Q, 10R) since the first semiconductor material block 10X and the second semiconductor material block 20X have substantially the same horizontal cross-sectional shape.

Formation of the stack of the first semiconductor material block 10X and the second semiconductor material block 20X may be performed concurrently with formation of a gate electrode stack for another semiconductor device, such as a field effect transistor, that is formed on the same substrate 8.

A dielectric spacer 70 may be formed on the sidewalls of the stack of the first semiconductor material block 10X and the second semiconductor material block 20X by a conformal deposition of a dielectric layer (not shown) followed by an anisotropic etch such as a reactive ion etch. The dielectric spacer 70 may comprise silicon oxide, silicon nitride, a insulating metal oxide, an insulating metal nitride, or a stack thereof. Methods of forming the dielectric spacer 70 are well known in the art.

Figure 3A:
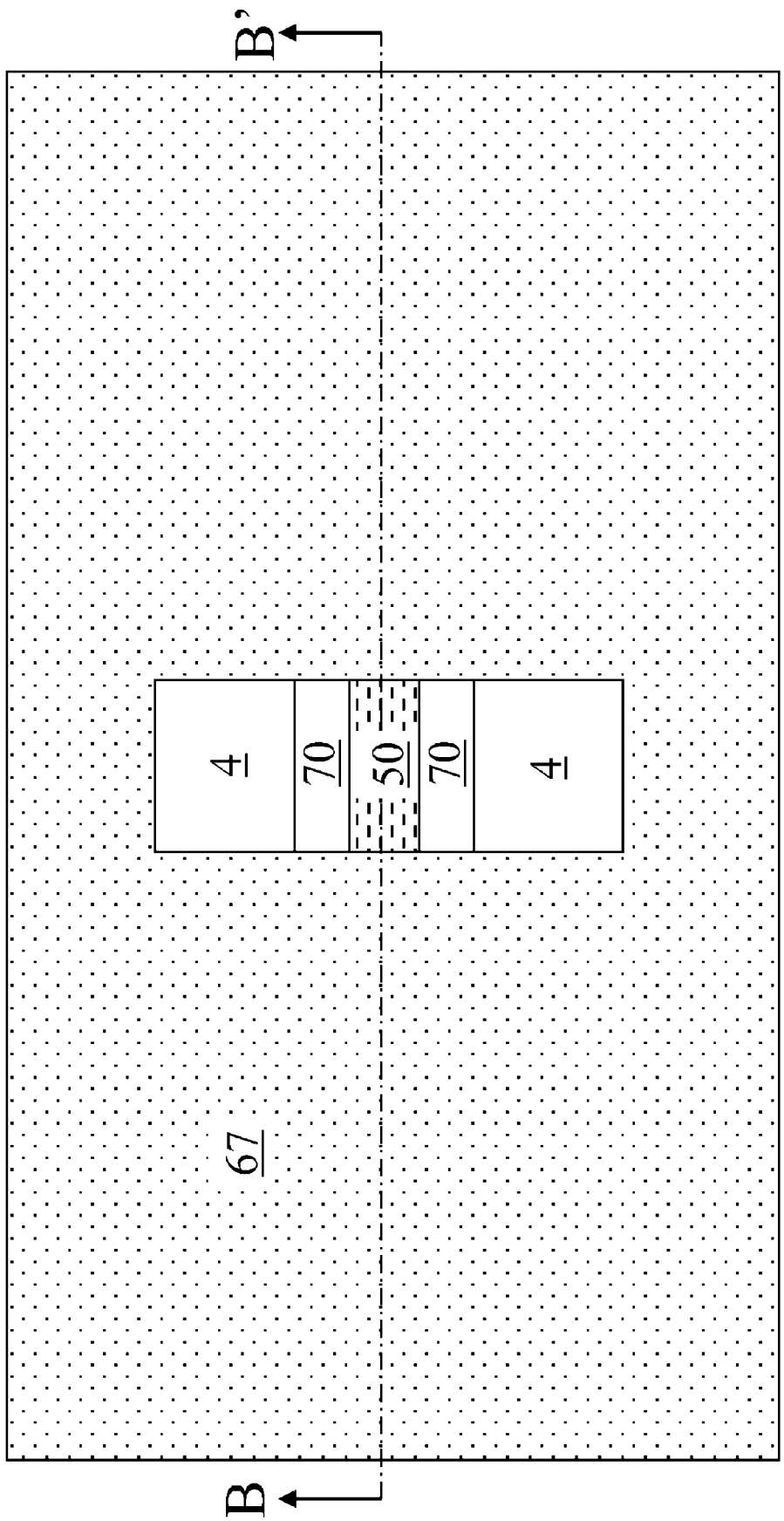
Figure 3B:
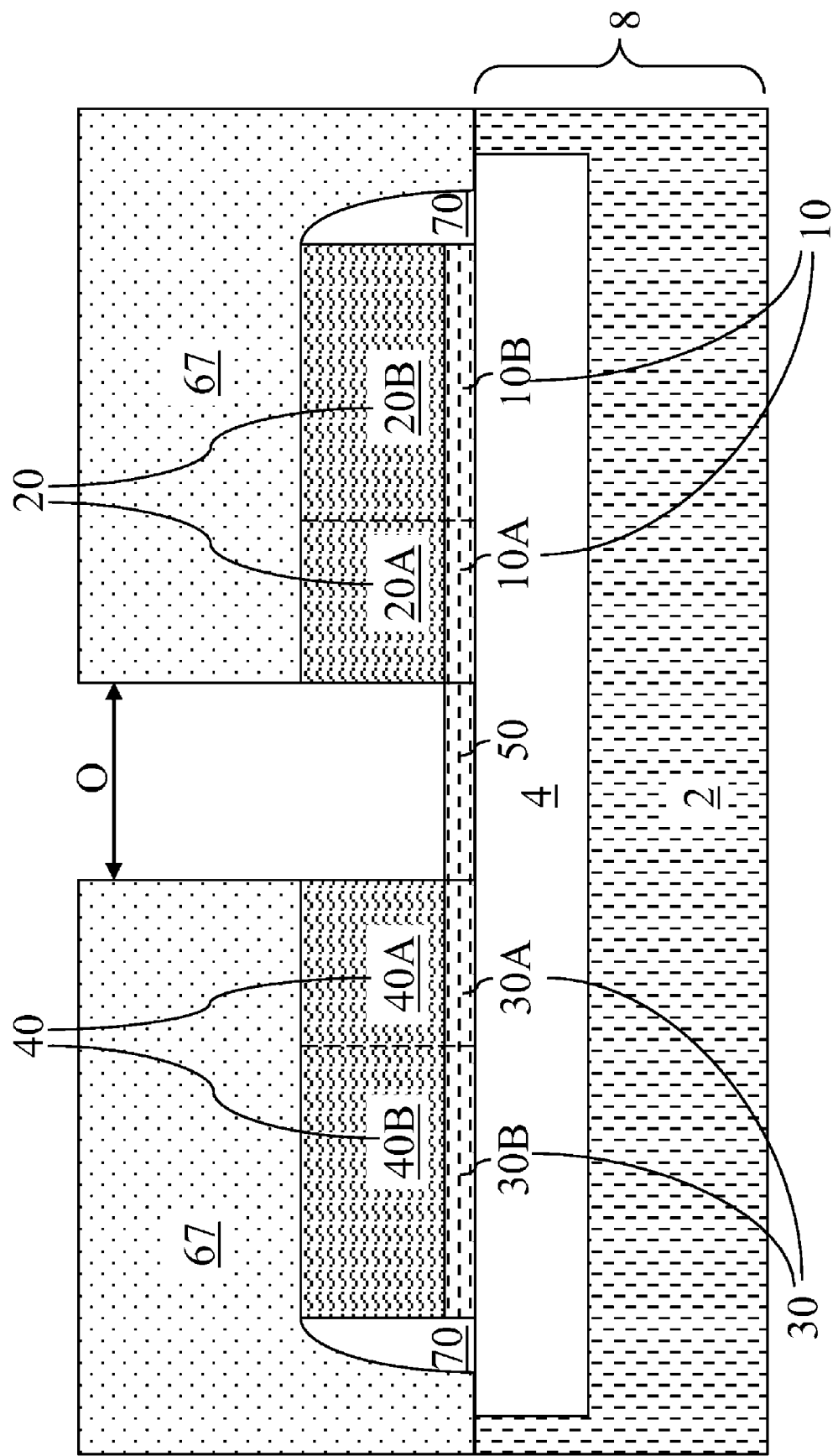

Referring to FIGS. 3A and 3B, a second photoresist 67 is applied to the second semiconductor material block 20X (See FIG. 2B) and lithographically patterned such that an opening O is formed in the pattern over a portion of the primary second semiconductor material sub-portion 20P. The size and location of the opening O may be changed to produce different semiconductor structures having different geometrical relationships between various components of the semiconductor structure in various embodiments of the present invention, as will be shown below.

The portion of the primary second semiconductor material sub-portion 20P (See FIGS. 2A and 2B) within the opening O is etched, for example, by an anisotropic etch or by an isotropic etch to expose a top surface of a portion of the primary first semiconductor material sub-portion 10P (See FIG. 2B). The etch removes the portion of the primary second semiconductor material sub-portion 20P, but does not substantially remove a portion of the primary first semiconductor material sub-portion 10P, which is herein referred to as a fully metallizable first semiconductor material sub-portion 50. Since the thickness of the first semiconductor layer 10L is selected during formation to enable full metallization of the first semiconductor layer 10L during a metallization step, the fully metallizable first semiconductor material sub-portion 50 may be fully metallized during the metallization step by consuming all of the material, which comprises the first semiconductor material, in the fully metallizable first semiconductor material sub-portion 50.

Preferably, the etch is selective to the first semiconductor material to enable self-limiting process that preserves the fully metallizable first semiconductor material sub-portion 50, while removing the etched portion of the primary second semiconductor material sub-portion 20P. The anisotropic etch may be a reactive ion etch. The isotropic etch may be a wet etch. Preferably, the etch is an anisotropic etch that provides a pair of substantially vertical sidewalls in the primary second semiconductor material sub-portion 20P.

The remaining portions of the second semiconductor material block 20X and the first semiconductor material block 10X comprises a first semiconductor stack containing some portions of the of the second semiconductor material block 20X and the first semiconductor material block 10X, a second semiconductor stack containing some other portions of the second semiconductor material block 20X and the first semiconductor material block 10X, and the fully metallizable first semiconductor material sub-portion 50 laterally abutting the first semiconductor stack and the second semiconductor stack.

The first semiconductor stack comprises a first semiconductor portion 10 comprising the first semiconductor material and a second semiconductor portion 20 comprising the second semiconductor material. The first semiconductor portion 10 comprises a narrow first semiconductor sub-portion 10A and a wide first semiconductor sub-portion 10B. The narrow first semiconductor sub-portion 10A is a remaining portion of the primary first semiconductor material sub-portion 10P that laterally abuts, and has the same width as, the fully metallizable first semiconductor material sub-portion 50. The wide first semiconductor sub-portion 10B is the same as the secondary first semiconductor material sub-portion 10Q (See FIG. 2B) and has a width that is greater than the width of the fully metallizable first semiconductor material sub-portion 50. The second semiconductor portion 20 comprises a narrow second semiconductor sub-portion 20A, which is a remaining portion of the primary second semiconductor material sub-portion 20P and has substantially the same width as the fully metallizable second semiconductor material sub-portion 50, and a wide second semiconductor sub-portion 20B, which is the same as the secondary second semiconductor material sub-portion 20Q (See FIGS. 2A and 2B) and having a width that is greater than the width of the fully metallizable second semiconductor material sub-portion 50.

The second semiconductor stack comprises a third semiconductor portion 30 comprising the first semiconductor material and a fourth semiconductor portion 40 comprising the second semiconductor material. The third semiconductor portion 30 comprises a narrow third semiconductor sub-portion 30A and a wide third semiconductor sub-portion 30B. The narrow third semiconductor sub-portion 30A is another remaining portion of the primary first semiconductor material sub-portion 10P that laterally abuts, and has the same width as, the fully metallizable first semiconductor material sub-portion 50. The wide third semiconductor sub-portion 30B is the same as the tertiary first semiconductor material sub-portion 10R (See FIG. 2B) and has another width that is greater than the width of the fully metallizable first semiconductor material sub-portion 50. The fourth semiconductor portion 40 comprises a narrow fourth semiconductor sub-portion 40A, which is another remaining portion of the primary second semiconductor material sub-portion 20P and has substantially the same width as the fully metallizable second semiconductor material sub-portion 50, and a wide fourth semiconductor sub-portion 40B, which is the same as the tertiary second semiconductor material sub-portion 20R (See FIGS. 2A and 2B) and has another width that is greater than the width of the fully metallizable second semiconductor material sub-portion 50.

The narrow first semiconductor sub-portion 10A and the narrow second semiconductor sub-portion 20A collectively constitute a first narrow region (10A, 20A). The wide first semiconductor sub-portion 10B and the wide second semiconductor sub-portion collectively constitute a first wide region (10B, 20B). The narrow third semiconductor sub-portion 30A and the narrow fourth semiconductor sub-portion collectively constitute a second narrow region (30A, 40A). The wide third semiconductor sub-portion 30B and the wide fourth semiconductor sub-portion 40B collectively constitute a second wide region (30B, 40B).

The first semiconductor stack comprises the first narrow region (10A, 20A) and the first wide region (10B, 20B). The second semiconductor stack comprises the second narrow region (30A, 40A) and the second wide region (30B, 40B).

Exposed portions of the dielectric spacer 70 within the opening O may remain substantially the same, reduced in size, or removed within the opening O. Preferably, the opening overlies an area contained with the insulator region 4.

Figure 4A:
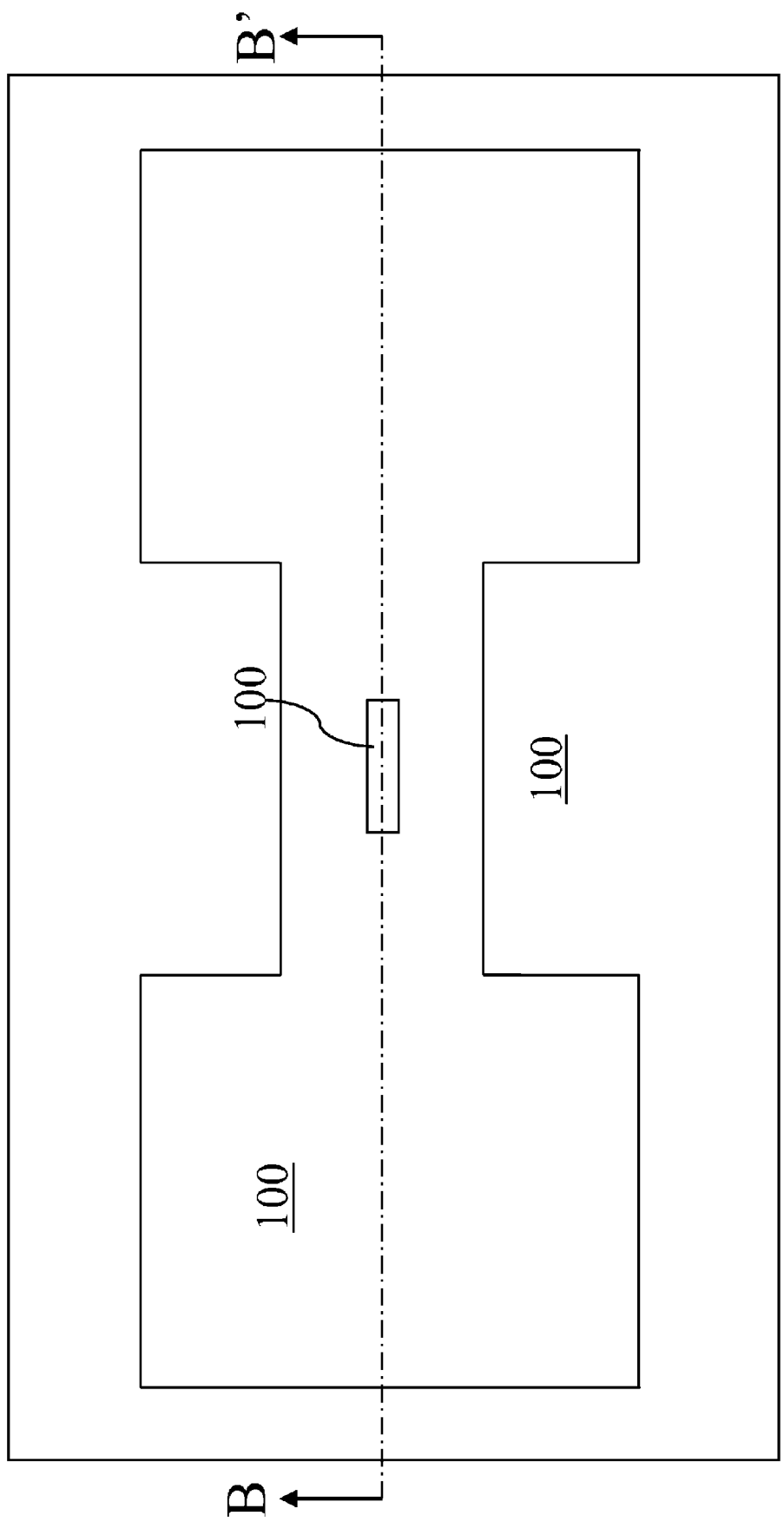
Figure 4B:
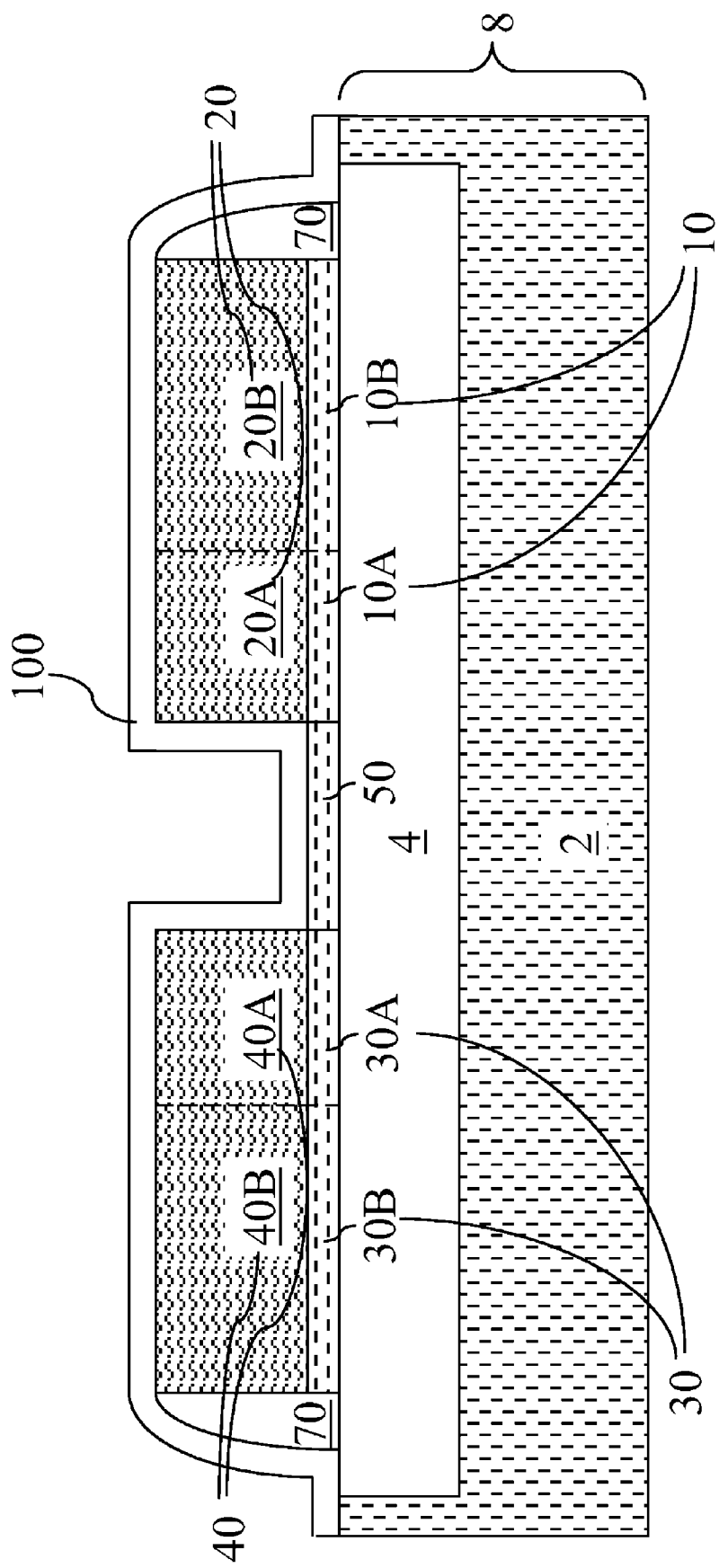

Referring to FIGS. 4A and 4B, a metal layer is formed on the first exemplary semiconductor structure for metallization of exposed semiconductor surfaces. Specifically, a metal layer 100, which comprises a metal that can react with the first semiconductor material and the second semiconductor material to form a first metal semiconductor alloy material and a second metal semiconductor material, respectively, is deposited. The thickness of the metal layer 100 is selected to provide a sufficient amount of metal to the fully metallizable second semiconductor material sub-portion 50 to enable full metallization of the fully metallizable second semiconductor material sub-portion 50. For example, the thickness of the metal layer 100 may be from about 10 nm to about 50 nm, and preferably from about 5 nm to about 15 nm, although lesser and greater thicknesses are explicitly contemplated herein. Such a metal layer can be readily deposited by any suitable deposition technique, including, but not limited to: chemical vapor deposition (CVD), physical vapor deposition (PVD), and atomic layer deposition (ALD). The deposition process preferably provides sufficient sidewall coverage on the sidewalls of the narrow second semiconductor region 40A and the another narrow second semiconductor region 40A that adjoin the metallizable second semiconductor material sub-portion 50. The metal layer 100 may be deposited alone, or together with a metal nitride capping layer (not shown) containing a metal nitride material such as TiN or TaN and having a thickness ranging from about 5 nm to about 50 nm, preferably from about 10 nm to about 20 nm.

In case the first semiconductor material comprises silicon and the second semiconductor material comprises a silicon germanium alloy, the metal forms a metal silicide and a metal silicide germanide alloy. Non-limiting examples of the metal that forms a metal silicide and a metal silicide germanide alloy include W, Ti, Ta, Co, Ni, Pt, and alloys thereof.

Figure 5A:
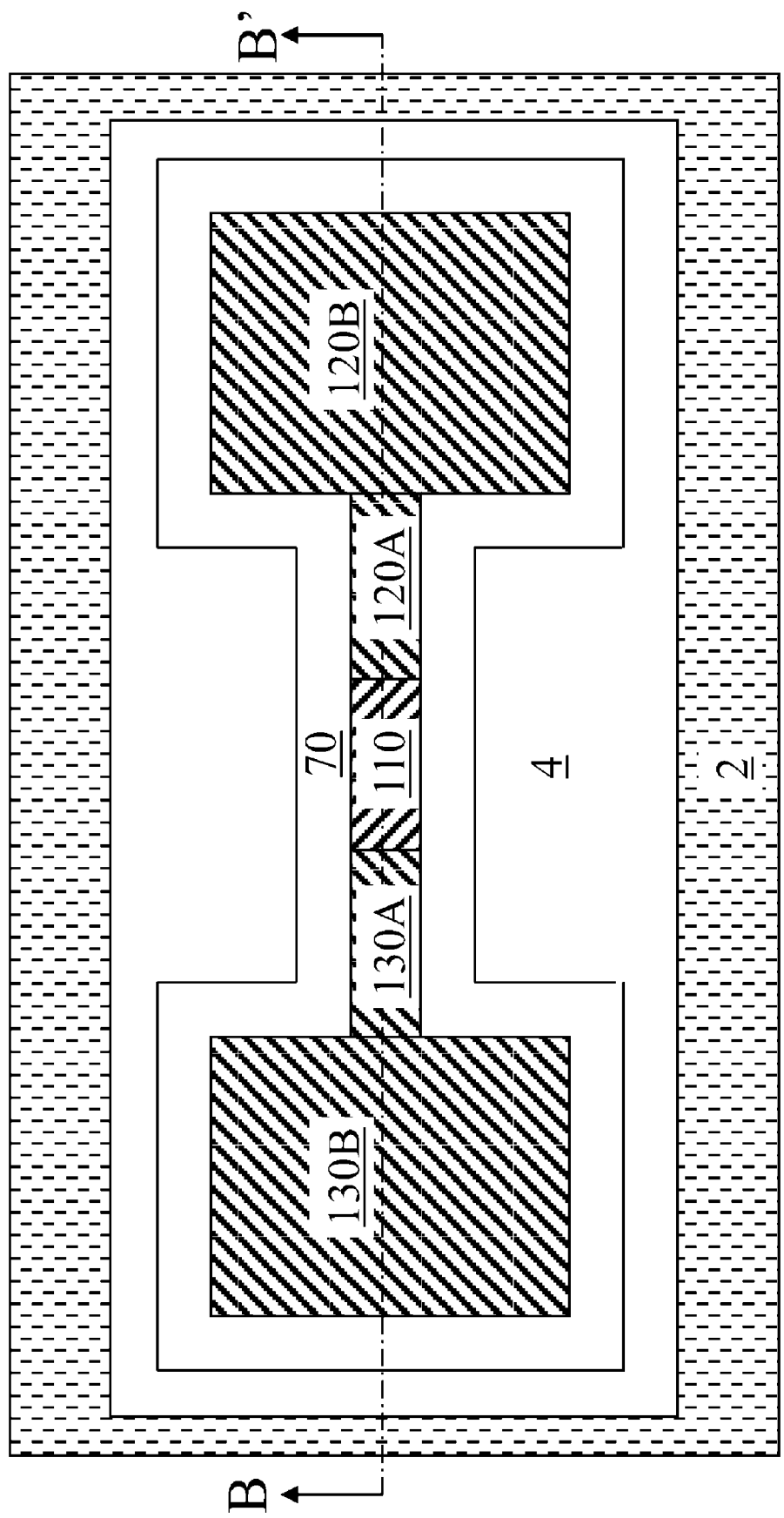
Figure 5B:
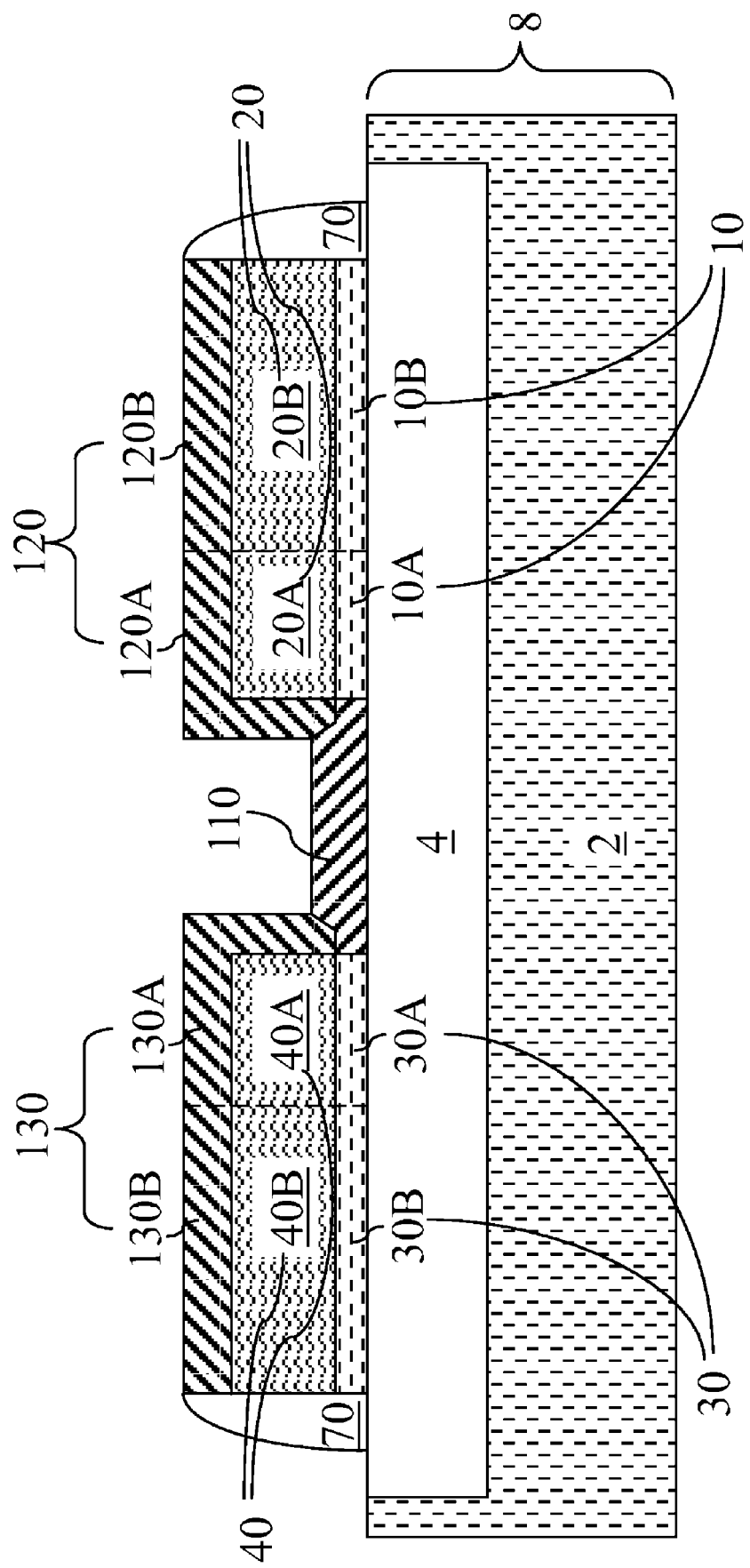

Referring to FIGS. 5A and 5B, the first exemplary semiconductor structure is then annealed at a pre-determined elevated temperature at which the metal layer 100 reacts with various exposed semiconductor surfaces and form metal semiconductor alloys. Specifically, the fully metallizable second semiconductor material sub-portion 50 reacts with the metal layer 100 to form a first metal semiconductor alloy portion 110 comprising the first metal semiconductor alloy material, which is an alloy of the first semiconductor material and the metal of the metal layer 100. The entirety of the fully metallizable second semiconductor material sub-portion 50 reacts with the metal layer 100, and hence, a full metallization of the fully metallizable second semiconductor material sub-portion 50 is performed. Consequently, the first metal semiconductor alloy portion 110 vertically abuts the insulator region 4.

A sidewall of the narrow second semiconductor sub-portion 20A that directly adjoins the fully metallizable second semiconductor material sub-portion 50 and a top surface of the narrow second semiconductor region 20A are metallized by reacting with the metal layer 100 to form a narrow second metal semiconductor alloy sub-portion 120A. A top surface of the wide second semiconductor sub-portion 20B is metallized to form a wide second metal semiconductor alloy sub-portion 120B. The narrow second metal semiconductor alloy sub-portion 120A and the wide second metal semiconductor alloy sub-portion 120B collectively constitute a second metal semiconductor alloy portion 120 comprising a second metal semiconductor alloy material, which is an alloy of the second semiconductor material with the metal of the metal layer 100.

A sidewall of the narrow fourth semiconductor sub-portion 40A that directly adjoins the fully metallizable second semiconductor material sub-portion 50 and a top surface of the narrow fourth semiconductor region 40A are metallized by reacting with the metal layer 100 to form a narrow third metal semiconductor alloy sub-portion 130A. A top surface of the wide fourth semiconductor sub-portion 40B is metallized to form a wide third metal semiconductor alloy sub-portion 130B. The narrow third metal semiconductor alloy sub-portion 130A and the wide third metal semiconductor alloy sub-portion 130B collectively constitute a third metal semiconductor alloy portion 130 comprising the second metal semiconductor alloy material.

Thus, each of the narrow second semiconductor region 20A and the wide second semiconductor region 20B is partially metallized, i.e., the metallization process does not consume the entirety of the narrow second semiconductor region 20A or the entirety of the wide second semiconductor region 20B.

The metallization process is effected by an anneal, which is typically performed in an inert gas atmosphere, e.g., He, Ar, $N_2$, or forming gas, at a relatively low temperature ranging from about 100° C. to about 600° C., preferably from about 300° C. to about 500° C., and most preferably from about 300° C. to about 450° C., by using a continuous heating regime or various ramp and soak heating cycles. Unreacted portions of the metal layer and the optional metal nitride capping layer are removed after formation of the various metal semiconductor alloy portions. For certain metals having multiple phases of a metal semiconductor alloy, such as Co, Ti, and Ni, a second anneal may be employed to transform an intermediate metal semiconductor alloy phase to a final metal semiconductor alloy phase to increase the conductivity of the metal semiconductor alloy. Subsequently, unreacted portions of the metal layer 100 are removed.

Figure 6A:
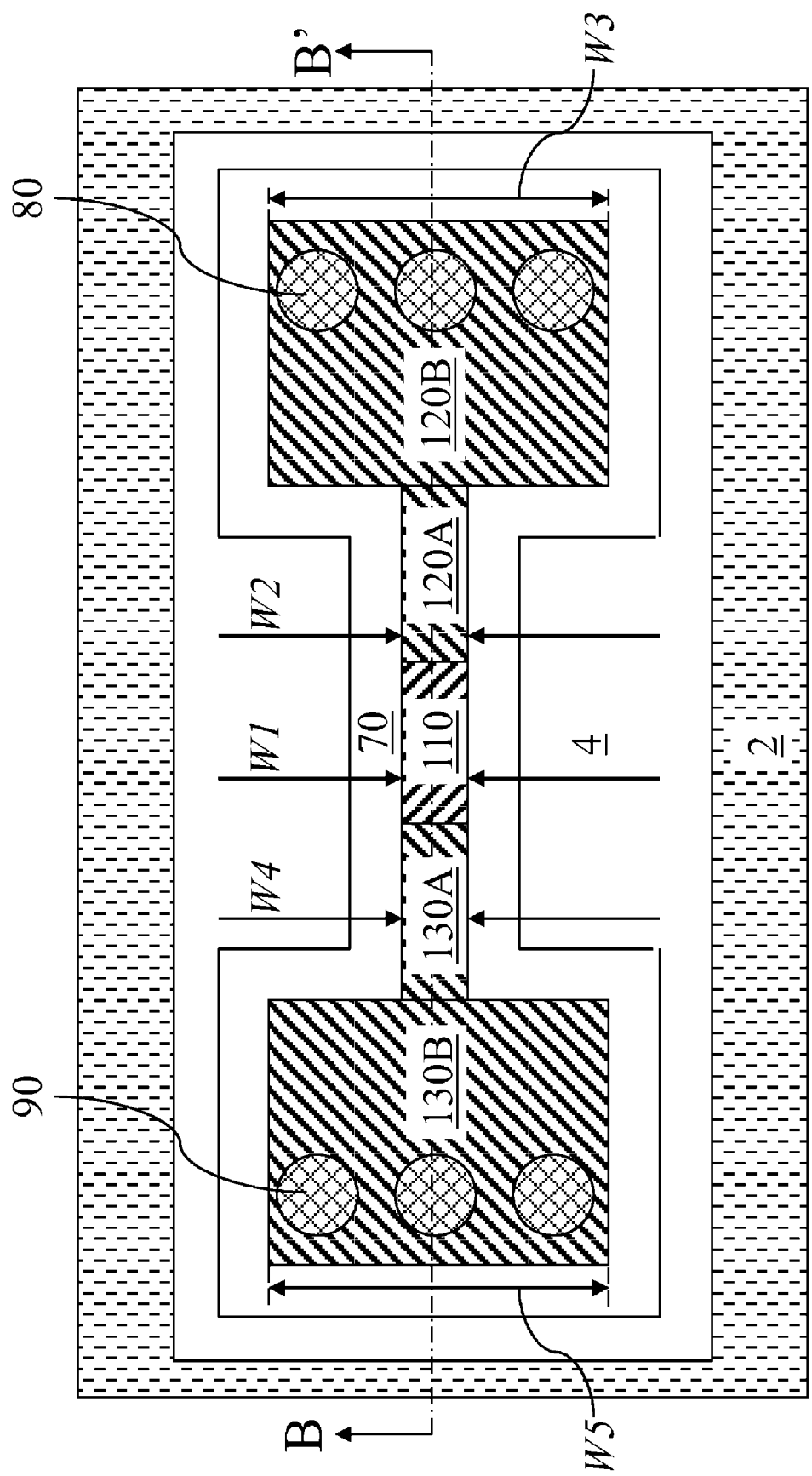
Figure 6B:
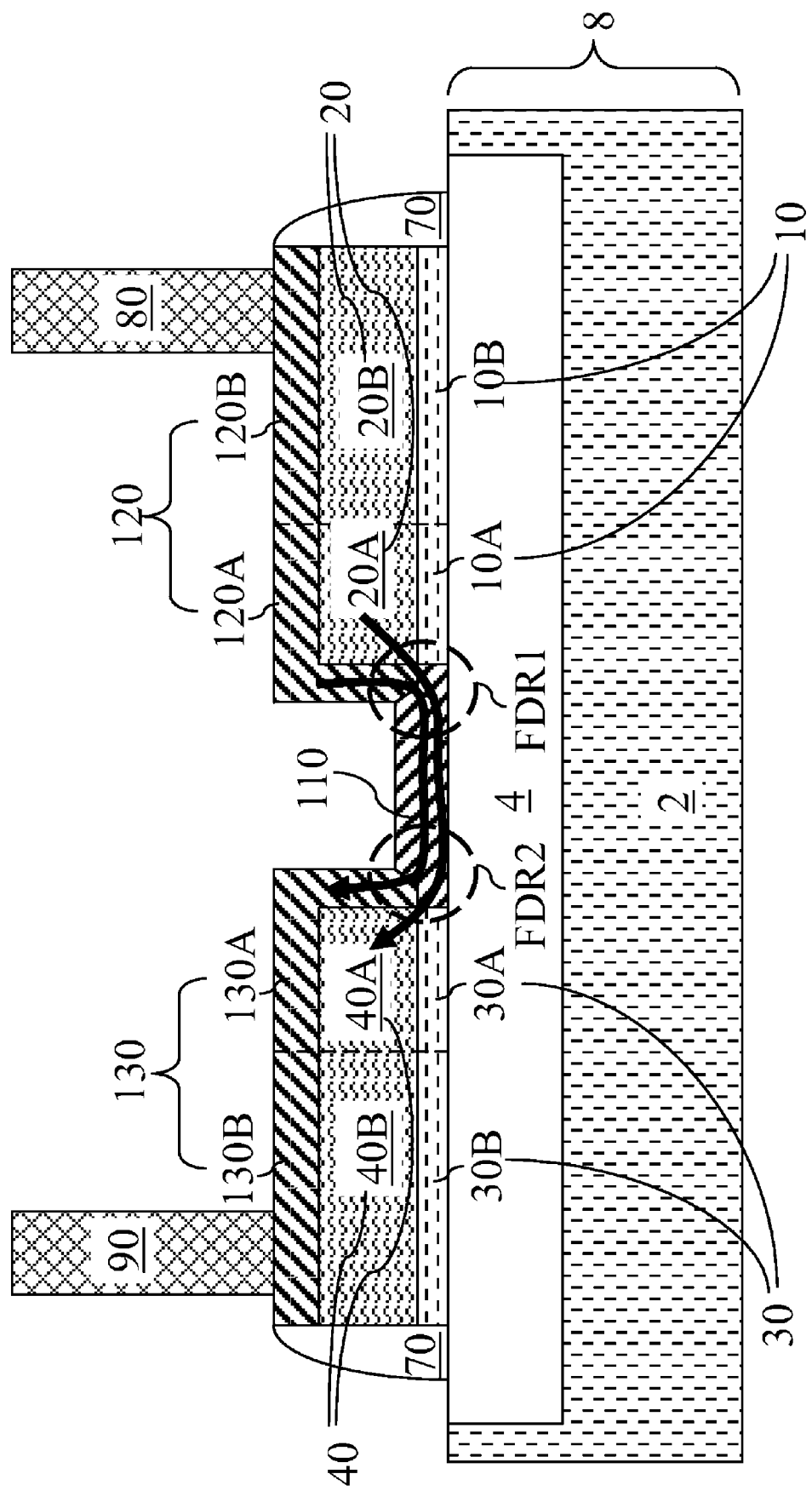

Referring to FIGS. 6A and 6B, a middle-of-line (MOL) dielectric layer (not shown) is formed over the first metal semiconductor alloy portion 110, the second metal semiconductor alloy portion 120, and the third metal semiconductor alloy portion 130. The MOL dielectric layer may comprise a stack of a mobile ion diffusion barrier layer such as a silicon nitride layer and a silicon oxide based dielectric layer that may comprise undoped silicate glass (USG), fluorosilicate glass (FSG), phosphosilicate glass (PSG), or borophosphosilicate glass (BSG). The MOL dielectric layer may comprise a low-k CVD dielectric material such as a SiCOH compound or an organosilicate glass instead of the silicon oxide based dielectric layer.

At least one first metal contact via 80 is formed directly on the second metal semiconductor alloy portion 120, and at least one second metal contact via 90 is formed directly on the third metal semiconductor alloy portion 130.

The second metal semiconductor alloy portion 120 comprises the narrow second metal semiconductor alloy sub-portion 120A and the wide second metal semiconductor alloy sub-portion 120B. The third metal semiconductor alloy portion 130 comprises the narrow third metal semiconductor alloy sub-portion 130A and the wide third metal semiconductor alloy sub-portion 130B. At least one first metal contact via 80 directly contacts the wide second metal semiconductor alloy sub-portion 120B. At least one second metal contact via 90 directly contacts the wide third metal semiconductor alloy sub-portion 130B.

The first metal semiconductor alloy portion 110 has a first width W1. The first semiconductor stack (10, 20) comprises a first narrow region (10A, 20A) having a second width W2 and a first wide region having a third width W3. The first narrow region (10A, 20A) laterally abuts the first metal semiconductor alloy portion 110. The first width W1 is the same as the second width W2 and is less than the third width W3. The first width W1, the second width W2, and the third width W3 are measured in a direction parallel to an interface between the first metal semiconductor alloy portion 110 and the first semiconductor portion 10. The direction of the measurement of the various widths is in a horizontal plane.

The second semiconductor stack (30, 40) comprises a second narrow region (30A, 40A) having a fourth width W4 and a second wide region (30B, 40B) having a fifth width W5. The second narrow region (30A, 40A) laterally abuts the first metal semiconductor alloy portion 110. The first width W1 is the same as the fourth width W4 and is less than the fifth width W5. The fourth width W4 and the fifth width W5 are measured in a direction parallel to an interface between the first metal semiconductor alloy portion 110 and the third semiconductor portion 30. The direction of the measurement of the various widths is in the horizontal plane.

The dielectric spacer 70 laterally abuts vertically coincident sidewalls of the first semiconductor portion 10 and the second semiconductor portion 20. The dielectric spacer 70 also laterally abuts vertically coincident sidewalls of the third semiconductor portion 30 and the fourth semiconductor portion 40. The dielectric spacer 70 abuts another sidewall of the first metal semiconductor alloy portion 110.

As an electrical fuse, the first exemplary semiconductor structure passes current through the at least one first metal contact via 80, the collection of the first semiconductor stack (10, 20) and the second metal semiconductor alloy portion 120, the first metal semiconductor alloy portion 110, the collection of the second semiconductor stack (30, 40) and the third metal semiconductor alloy portion 130, and the at least one second metal contact via 90. While the first narrow region (10A, 20A), the narrow second metal semiconductor alloy sub-portion 120A, the first metal semiconductor alloy portion 110, the second narrow region (30A, 40A), and the narrow third metal semiconductor alloy sub-portion 130A have the same width, the first metal semiconductor alloy portion 110 provides current crowding in a vertical plane as can be seen in FIG. 6B. Divergence of current density is non-zero at the first flux divergence region FDR1 and at the second flux divergence region FDR2 located at the interface between the first metal semiconductor alloy portion 110 and the first semiconductor portion 10 and at the interface between the first metal semiconductor alloy portion 110 and the third semiconductor portion 30, respectively. Thus, the first exemplary semiconductor structure provides two locations at which divergence of current density is substantially non-zero. In general, at least one region at which divergence of current density is substantially non-zero is provided in each embodiment, as will be shown below.

Figure 7A:
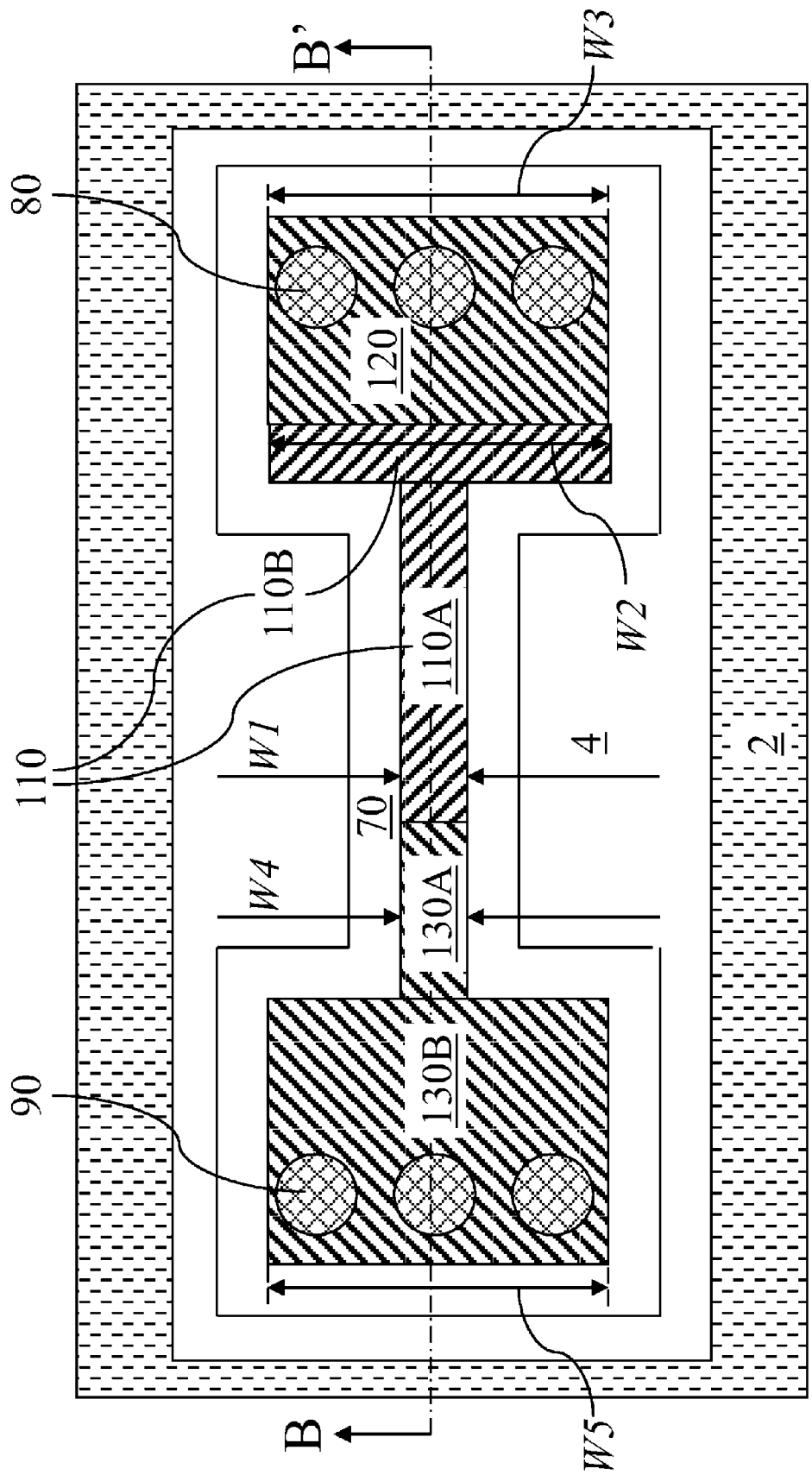
Figure 7B:
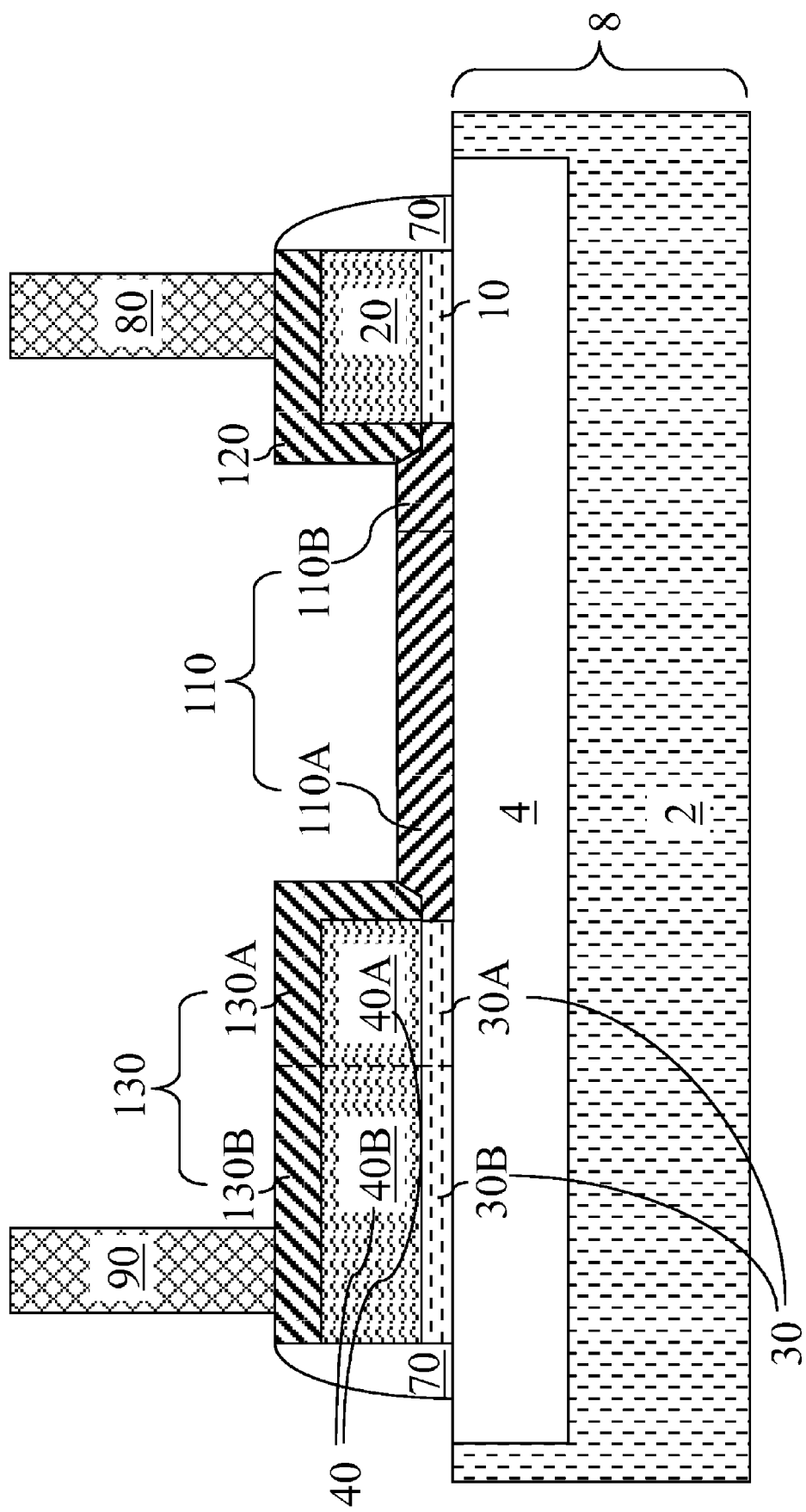

Referring to FIGS. 7A and 7B, a second exemplary semiconductor structure according to a second embodiment of the present invention is formed in the same manner as the first exemplary semiconductor structure according to the first embodiment. However, the location of the opening O in the second photoresist 67 (See FIGS. 3A and 3B) is adjusted such that the opening O is located not only over a portion of the primary second semiconductor material sub-portion 20P but also over a portion of the secondary second semiconductor material sub-portion 20Q (See FIGS. 2A and 2B).

The third metal semiconductor alloy portion 130 comprises the narrow third metal semiconductor alloy sub-portion 130A and the wide third metal semiconductor alloy sub-portion 130B. At least one first metal contact via 80 directly contacts the second metal semiconductor alloy portion 120. At least one second metal contact via 90 directly contacts the wide third metal semiconductor alloy sub-portion 130B.

The first metal semiconductor alloy portion 110 comprises a narrow region, which is a narrow first metal semiconductor alloy sub-portion 110A, and a wide region, which is a wide first metal semiconductor alloy sub-portion 110B. The narrow first metal semiconductor alloy sub-portion 110A has a first width W1 and the wide first metal semiconductor alloy sub-portion 110B has a second width W2. The second width W2 is greater than the first width W1. The wide first metal semiconductor alloy sub-portion 110B laterally abuts the first semiconductor stack (10, 20). The first semiconductor stack (10, 20) has a third width W3. The third width W3 is equal to the second width W2. The first width W1, the second width W2, and the third width W3 are measured in a direction parallel to an interface between the first metal semiconductor alloy portion 110 and the first semiconductor portion 10. The direction of the measurement of the various widths is in a horizontal plane.

The second semiconductor stack (30, 40) comprises a second narrow region (30A, 40A) having a fourth width W4 and a second wide region (30B, 40B) having a fifth width W5. The second narrow region (30A, 40A) laterally abuts the first metal semiconductor alloy portion 110. The first width W1 is the same as the fourth width W4 and is less than the fifth width W5. The fourth width W4 and the fifth width W5 are measured in a direction parallel to an interface between the first metal semiconductor alloy portion 110 and the third semiconductor portion 30. The direction of the measurement of the various widths is in the horizontal plane.

Figure 8A:
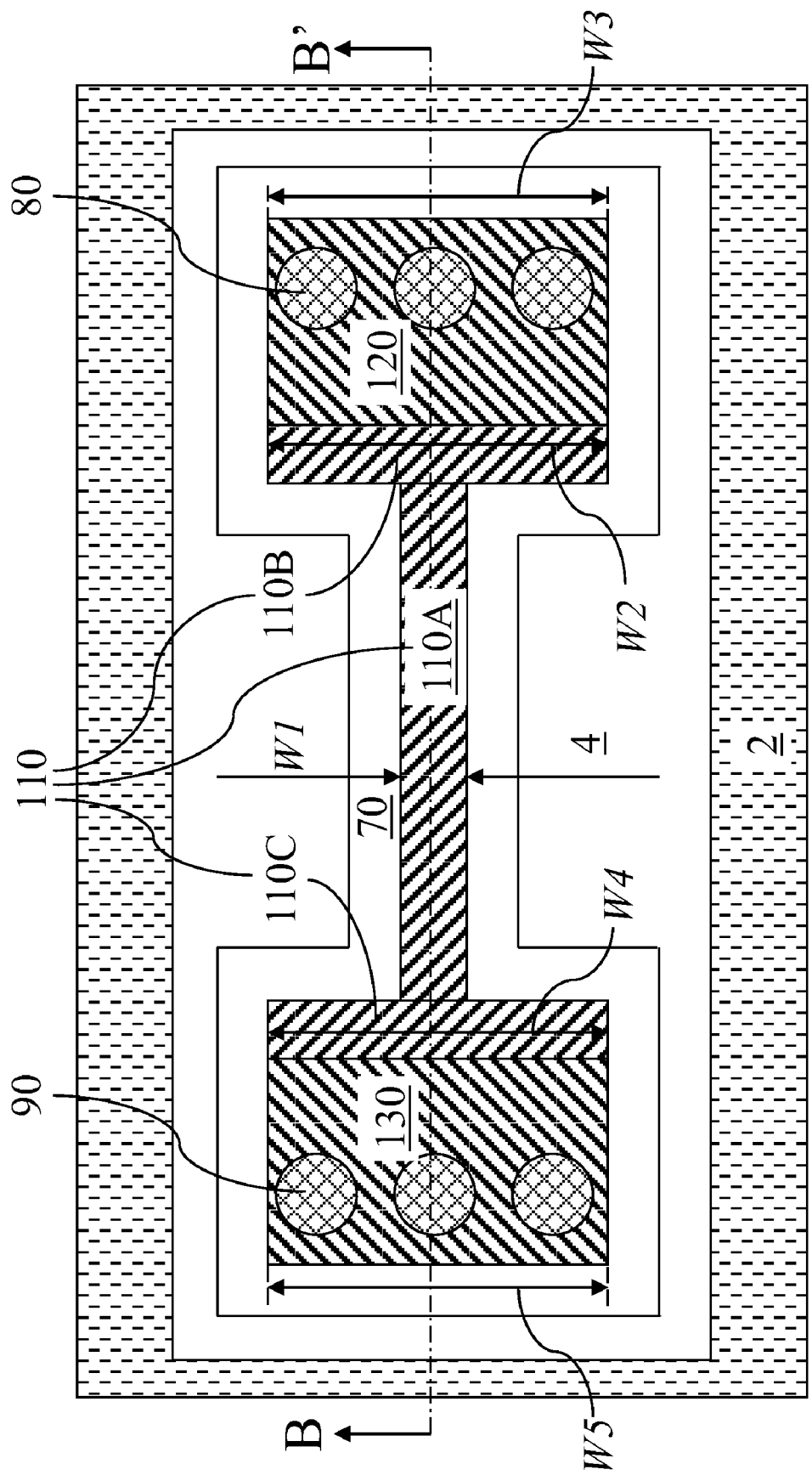
Figure 8B:
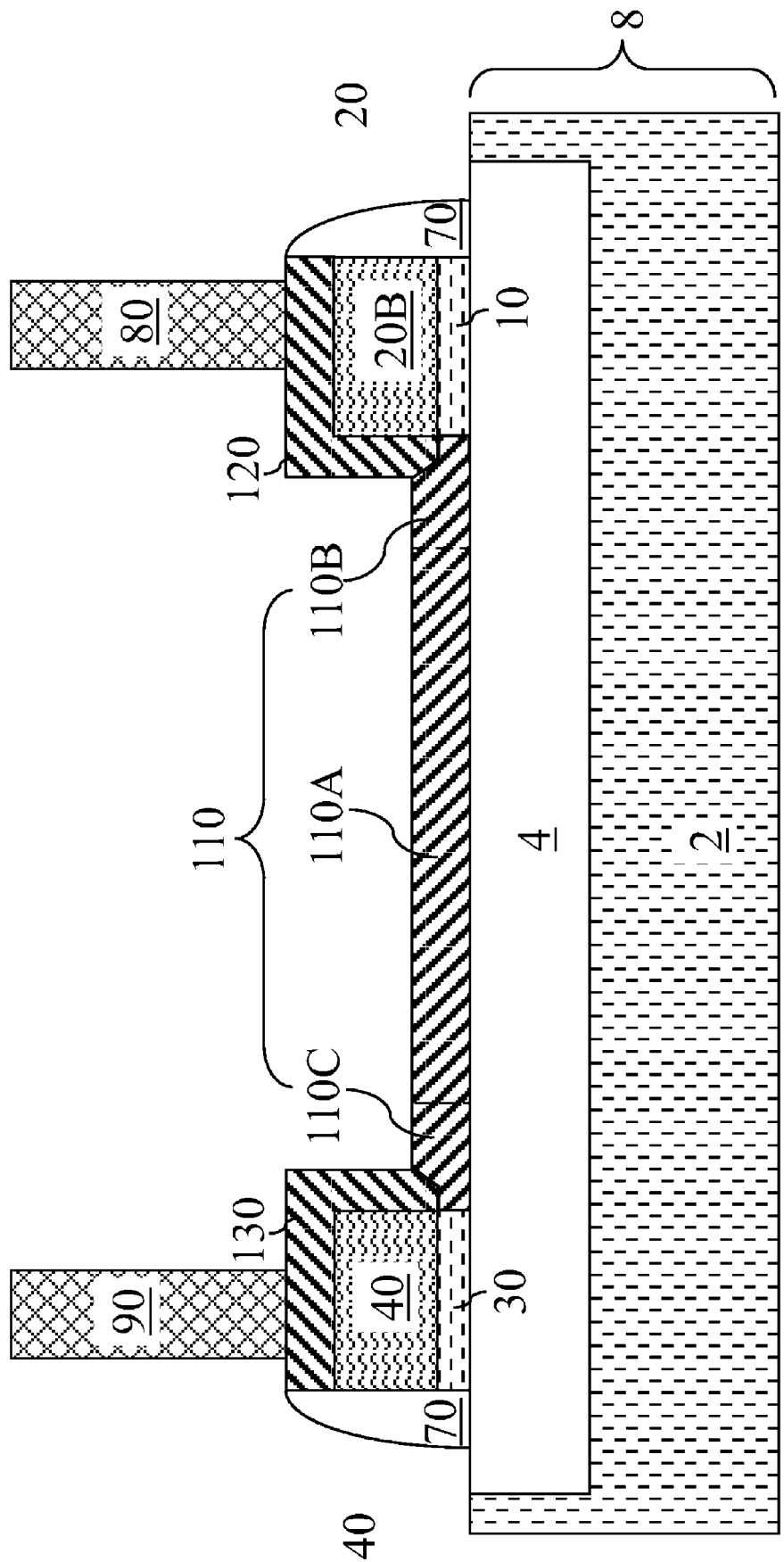

Referring to FIGS. 8A and 8B, a third exemplary semiconductor structure according to a third embodiment of the present invention is formed in the same manner as the first exemplary semiconductor structure according to the first embodiment. However, the location of the opening O in the second photoresist 67 (See FIGS. 3A and 3B) is adjusted such that the opening O is located not only over a portion of the primary second semiconductor material sub-portion 20P but also over a portion of the secondary second semiconductor material sub-portion 20Q and over a portion of the tertiary second semiconductor material sub-portion 20R (See FIGS. 2A and 2B).

At least one first metal contact via 80 directly contacts the second metal semiconductor alloy portion 120. At least one second metal contact via 90 directly contacts the third metal semiconductor alloy portion 130.

The first metal semiconductor alloy portion 110 comprises a narrow region, which is a narrow first metal semiconductor alloy sub-portion 110A, and a wide region, which is a wide first metal semiconductor alloy sub-portion 110B, and another wide region, which is another wide first metal semiconductor alloy sub-portion 110C. The narrow first metal semiconductor alloy sub-portion 110A has a first width W1. The wide first metal semiconductor alloy sub-portion 110B has a second width W2. The second width W2 is greater than the first width W1. The wide first metal semiconductor alloy sub-portion 110B laterally abuts the first semiconductor stack (10, 20). The first semiconductor stack (10, 20) has a third width W3. The third width W3 is equal to the second width W2.

The other wide first metal semiconductor alloy sub-portion 110C has a fourth width W4. The fourth width W4 is greater than the first width W1. The other wide first metal semiconductor alloy sub-portion 110C laterally abuts the second semiconductor stack (30, 40). The second semiconductor stack (30, 40) has a fifth width W5. The fifth width W5 is equal to the fourth width W4. The first width W1, the second width W2, the third width W3, the fourth width W4, and the fifth width W5 are measured in a direction parallel to an interface between the first metal semiconductor alloy portion 110 and the first semiconductor portion 10, which is also parallel to an interface between the first metal semiconductor alloy portion 110 and the third semiconductor portion 30. The direction of the measurement of the various widths is in a horizontal plane.

Figure 9A:
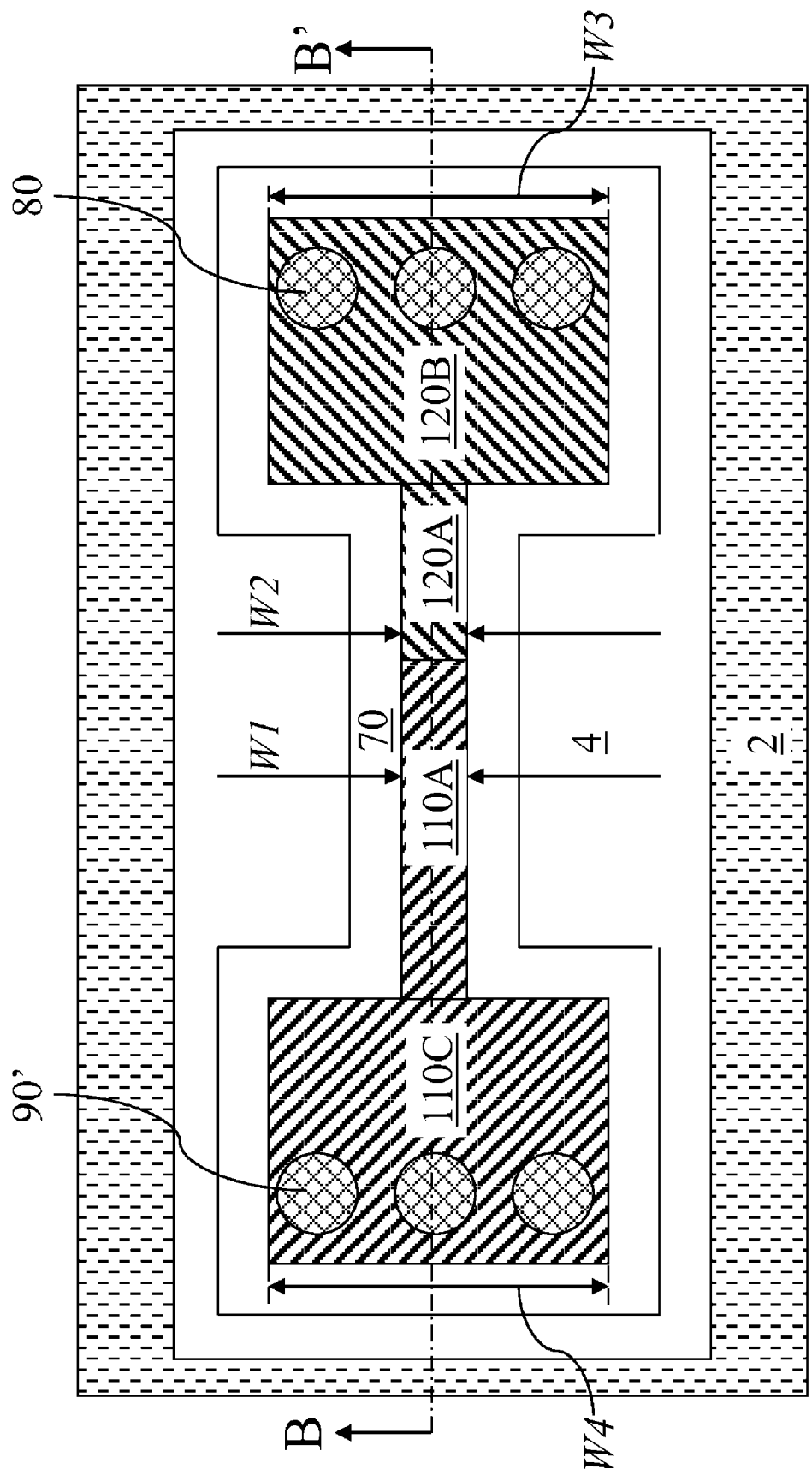
Figure 9B:
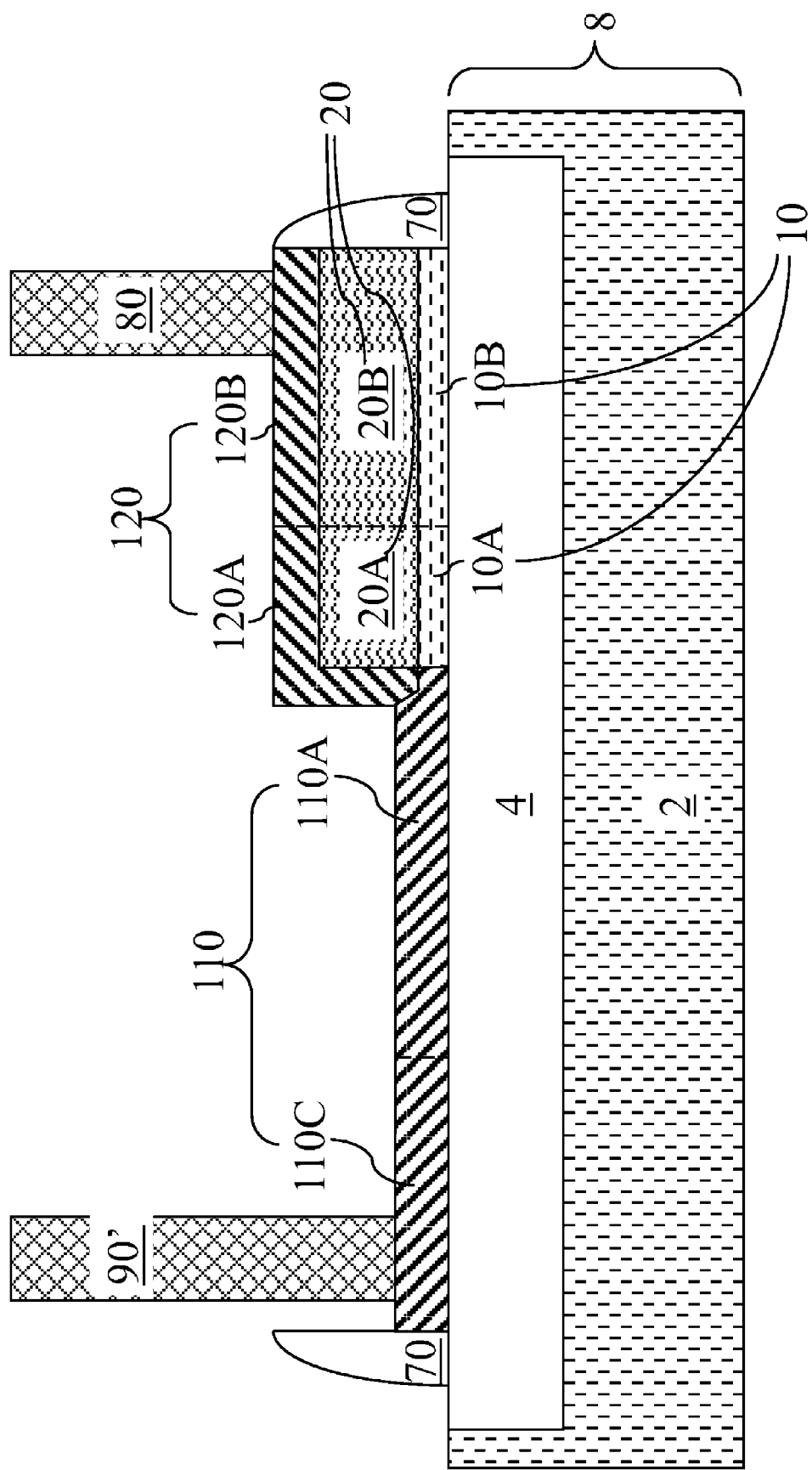

Referring to FIGS. 9A and 9B, a fourth exemplary semiconductor structure according to a fourth embodiment of the present invention is formed in the same manner as the first exemplary semiconductor structure according to the first embodiment. However, the location of the opening O in the second photoresist 67 (See FIGS. 3A and 3B) is adjusted such that the opening O is located not only over a portion of the primary second semiconductor material sub-portion 20P but also over the entirety of the tertiary second semiconductor material sub-portion 20R (See FIGS. 2A and 2B).

The second metal semiconductor alloy portion 120 comprises a narrow second metal semiconductor alloy sub-portion 120A and a wide second metal semiconductor alloy sub-portion 120B. A third metal semiconductor alloy portion is not formed in this embodiment. Also, a second semiconductor stack is not formed in this embodiment. At least one first metal contact via 80 directly contacts the wide second metal semiconductor alloy sub-portion 120B. At least one second metal contact via 90' directly contacts a wide first metal semiconductor alloy sub-portion 110C.

The first metal semiconductor alloy portion 110 comprises a narrow first metal semiconductor alloy sub-portion 110A and the wide first metal semiconductor alloy sub-portion 110C. The narrow first metal semiconductor alloy sub-portion 110A has a first width W1. The first semiconductor stack (10, 20) comprises a first narrow region (10A, 20A) having a second width W2 and a first wide region (10B, 20B) having a third width W3. The first narrow region (10A, 20A) laterally abuts the first metal semiconductor alloy portion 110. The first width W1 is the same as the second width W2 and is less than the third width W3. The wide first metal semiconductor alloy sub-portion 110C has a fourth width W4. The fourth width W4 is greater than the first width W1. The first width W1, the second width W2, the third width W3, and the fourth width W4 are measured in a direction parallel to an interface between the narrow first metal semiconductor alloy sub-portion 110A and the first semiconductor portion 10, which is also parallel to an interface between the narrow first metal semiconductor alloy sub-portion 110A and the wide first metal semiconductor alloy sub-portion 110C. The direction of the measurement of the various widths is in a horizontal plane.

Figure 10A:
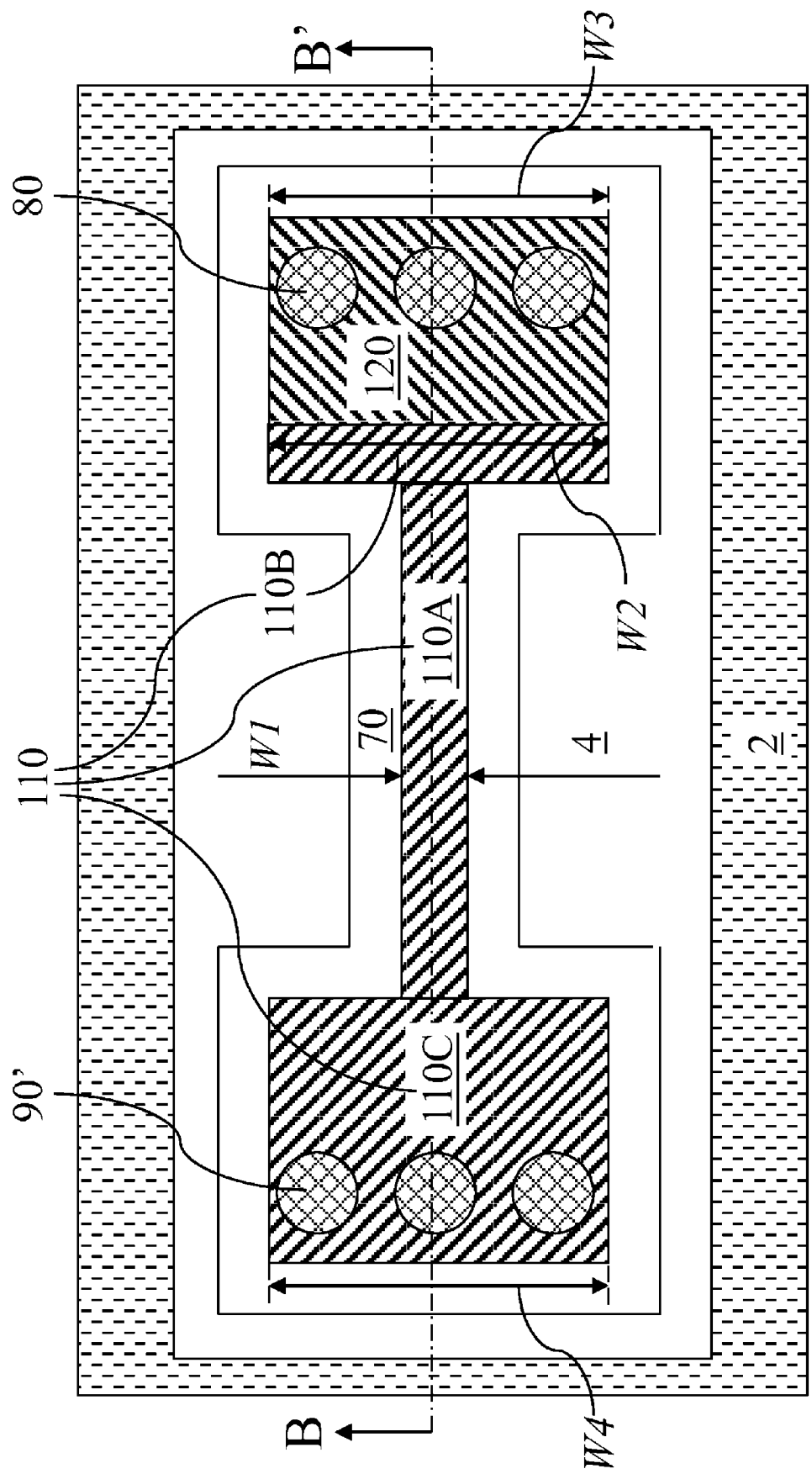
Figure 10B:
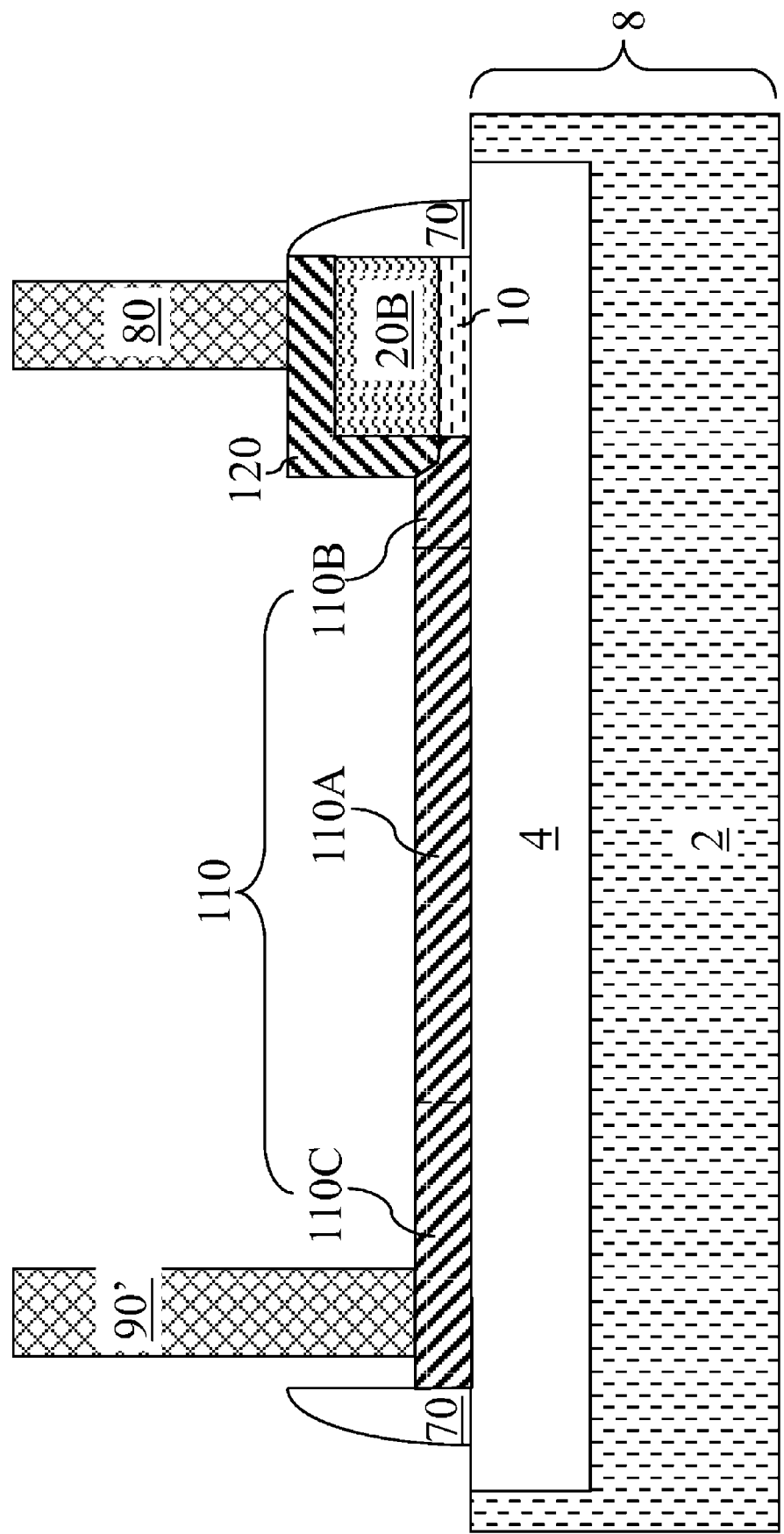

Referring to FIGS. 10A and 10B, a fifth exemplary semiconductor structure according to a fifth embodiment of the present invention is formed in the same manner as the first exemplary semiconductor structure according to the first embodiment. However, the location of the opening O in the second photoresist 67 (See FIGS. 3A and 3B) is adjusted such that the opening O is located not only over a portion of the primary second semiconductor material sub-portion 20P but also over the entirety of the tertiary second semiconductor material sub-portion 20R and a portion of the secondary second semiconductor material sub-portion 20Q (See FIGS. 2A and 2B).

A third metal semiconductor alloy portion is not formed in this embodiment. Also, a second semiconductor stack is not formed in this embodiment. At least one first metal contact via 80 directly contacts a second metal semiconductor alloy portion 120. At least one second metal contact via 90' directly contacts a wide first metal semiconductor alloy sub-portion 110C.

The first metal semiconductor alloy portion 110 comprises a narrow first metal semiconductor alloy sub-portion 110A, the wide first metal semiconductor alloy sub-portion 110C, and another wide first metal semiconductor alloy sub-portion 110B. The narrow first metal semiconductor alloy sub-portion 110A has a first width W1. The other wide first metal semiconductor alloy sub-portion 110B has a second width W2. The first semiconductor stack (10, 20) has a third width W3. The first semiconductor stack (10, 20) laterally abuts the other wide first metal semiconductor alloy sub-portion 110B. The third width W3 is the same as the second width W2 and is greater than the first width W1. The wide first metal semiconductor alloy sub-portion 110C has a fourth width W4. The fourth width W4 is greater than the first width W1. The first width W1, the second width W2, the third width W3, and the fourth width W4 are measured in a direction parallel to an interface between the first metal semiconductor alloy portion 110 and the first semiconductor portion 10, which is also parallel to an interface between the narrow first metal semiconductor alloy sub-portion 110A and the wide first metal semiconductor alloy sub-portion 110C. The direction of the measurement of the various widths is in a horizontal plane.

Figure 11A:
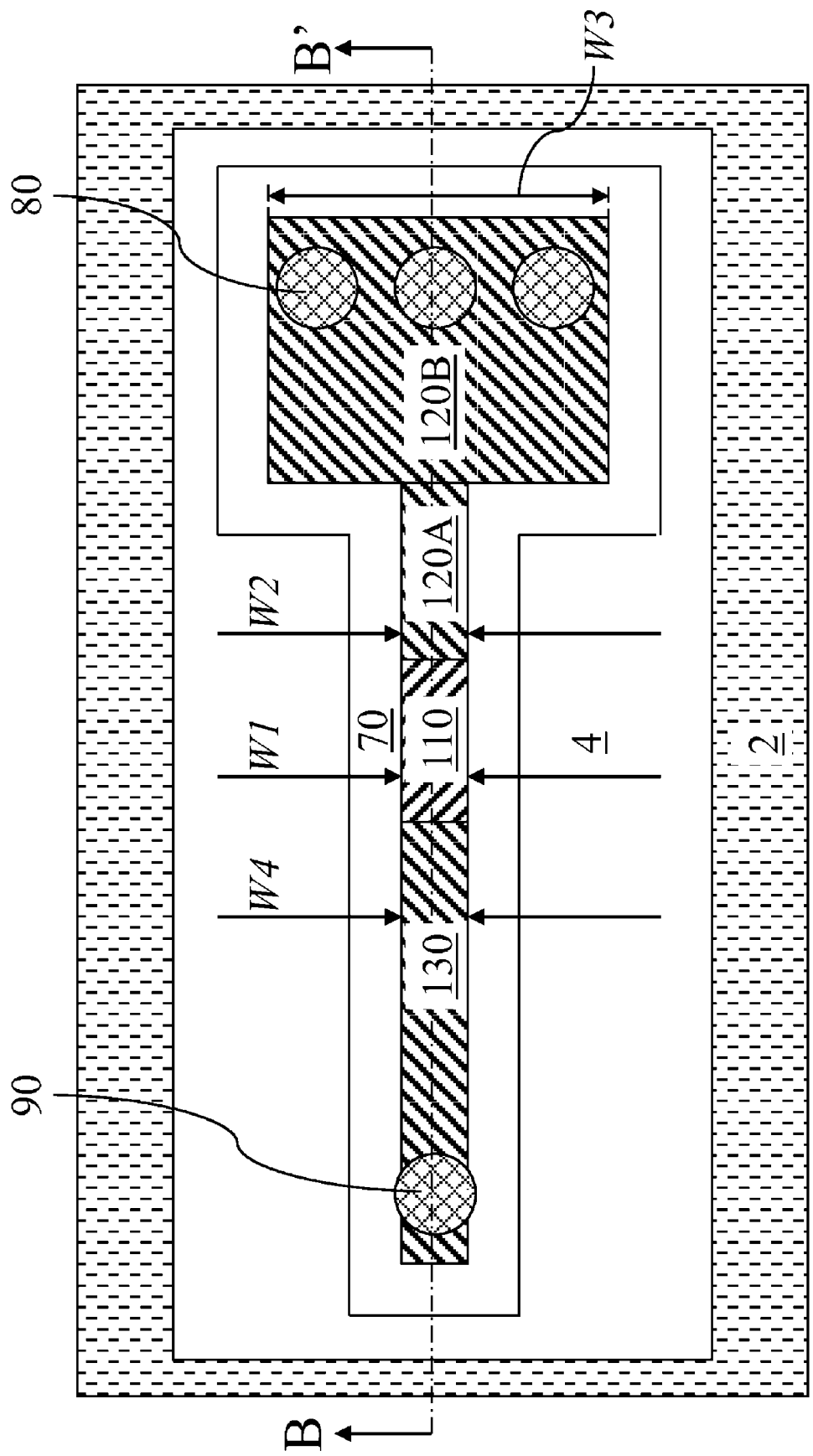
Figure 11B:
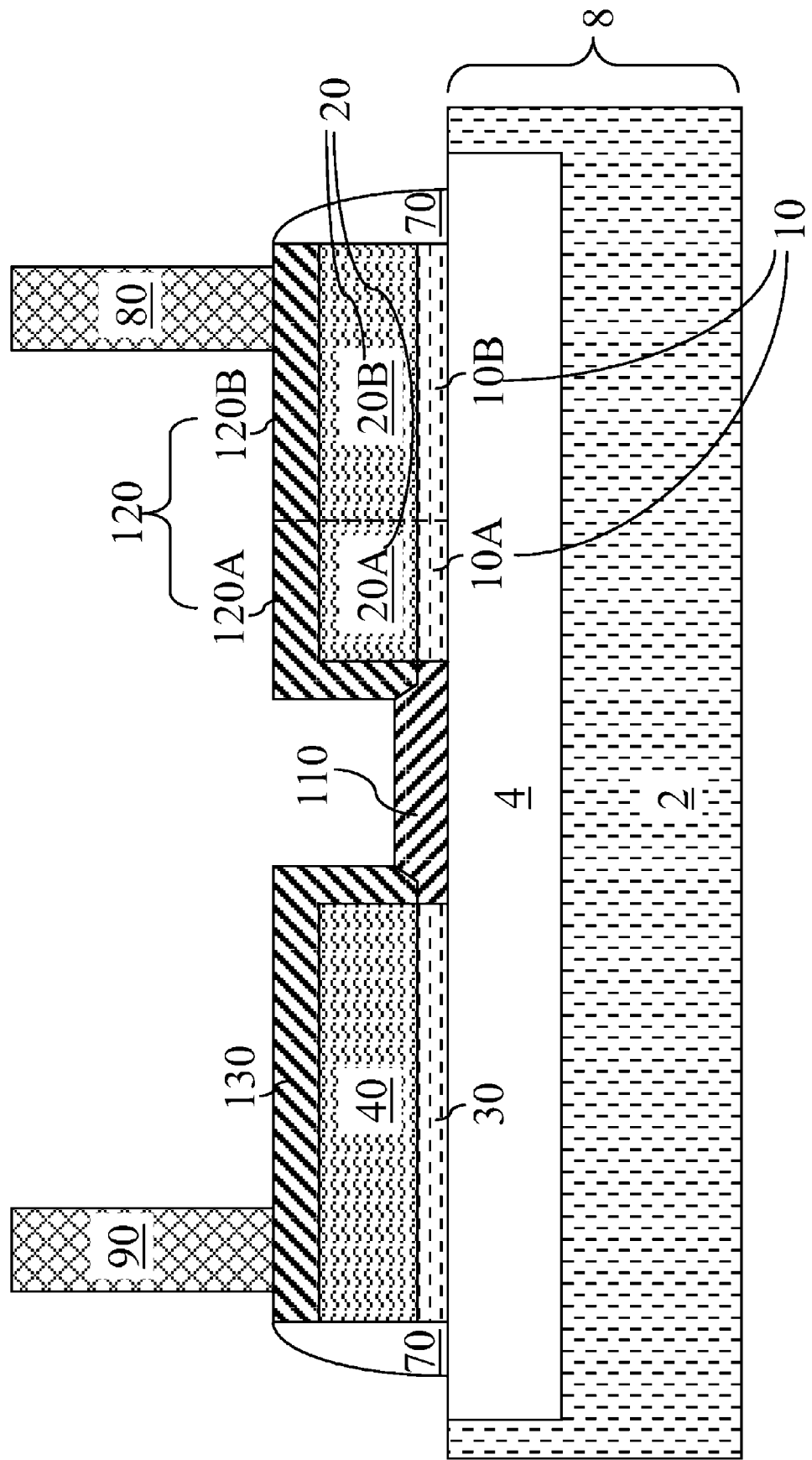

Referring to FIGS. 11A and 11B, a sixth exemplary semiconductor structure according to a sixth embodiment of the present invention is formed in the same manner as the first exemplary semiconductor structure according to the first embodiment. However, the tertiary second semiconductor material sub-portion 20R has the same width as the primary second semiconductor material sub-portion 20P (See FIGS. 2A and 2B).

The second metal semiconductor alloy portion 120 comprises the narrow second metal semiconductor alloy sub-portion 120A and the wide second metal semiconductor alloy sub-portion 120B. A second semiconductor stack (30, 40) comprises a third semiconductor portion 30 and a fourth semiconductor portion 40 as in the first embodiment. At least one first metal contact via 80 directly contacts the wide second metal semiconductor alloy sub-portion 120B. At least one second metal contact via 90 directly contacts a third metal semiconductor alloy portion 130.

The first metal semiconductor alloy portion 110 has a first width W1. The first semiconductor stack (10, 20) comprises a first narrow region (10A, 20A) having a second width W2 and a first wide region (10B, 20B) having a third width W3. The first narrow region (10A, 20A) laterally abuts the first metal semiconductor alloy portion 110. The first width W1 is the same as the second width W2 and is less than the third width W3. The second semiconductor stack (30, 40) has a fourth width W4. The fourth width W4 is the same as the first width W1. The first width W1, the second width W2, the third width W3, and the fourth width W4 are measured in a direction parallel to an interface between the first metal semiconductor alloy portion 110 and the first semiconductor portion 10, which is also parallel to an interface between the first metal semiconductor alloy portion 110 and the third semiconductor portion 30. The direction of the measurement of the various widths is in a horizontal plane. The first width W1, the second width W2, and the fourth width W4, which are the same among one another, and may be a lithographic minimum dimension. Consequently, a diameter of each of the at least one second metal contact via 90 may exceed the first width W1.

Figure 12A:
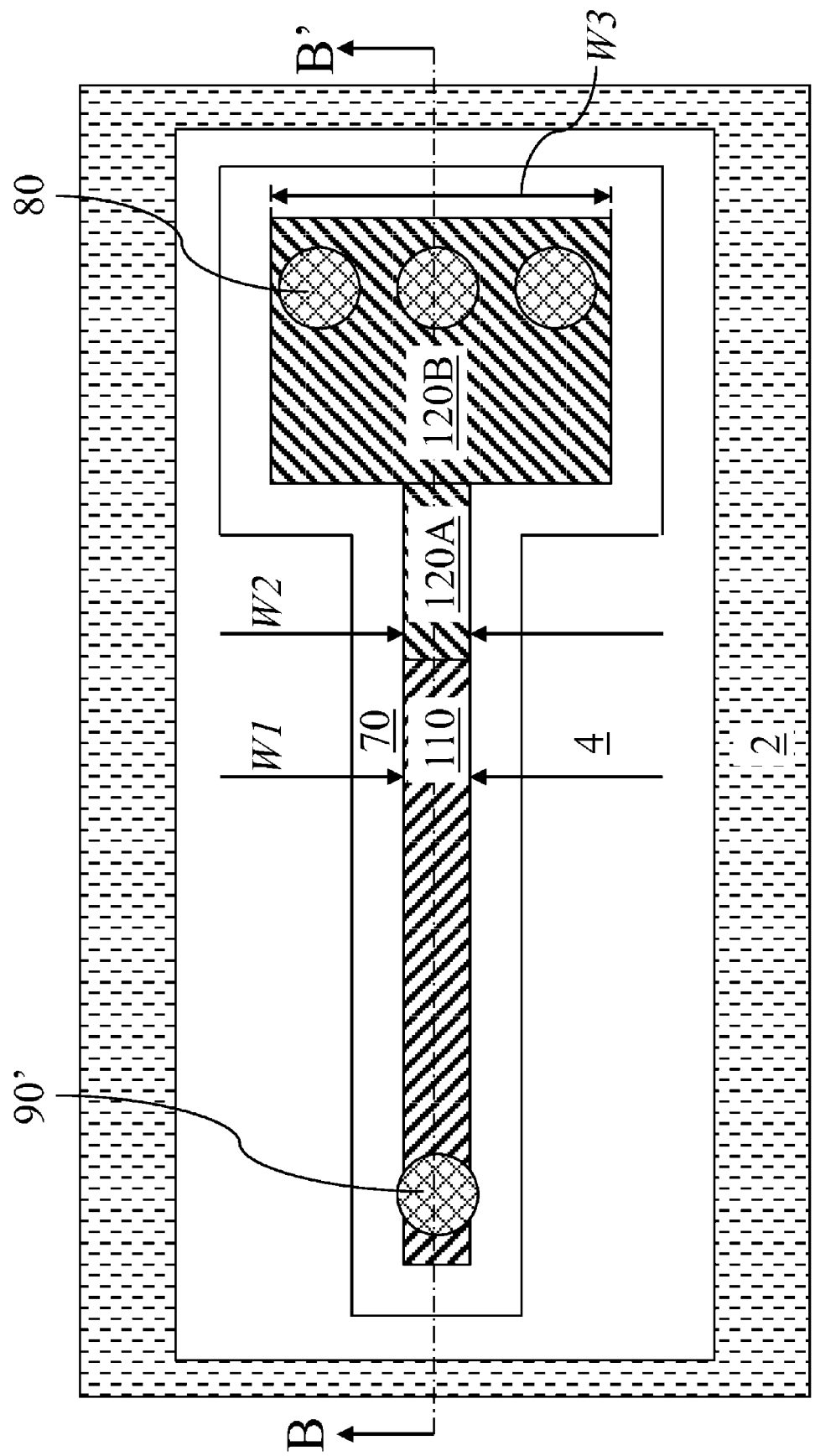
Figure 12B:
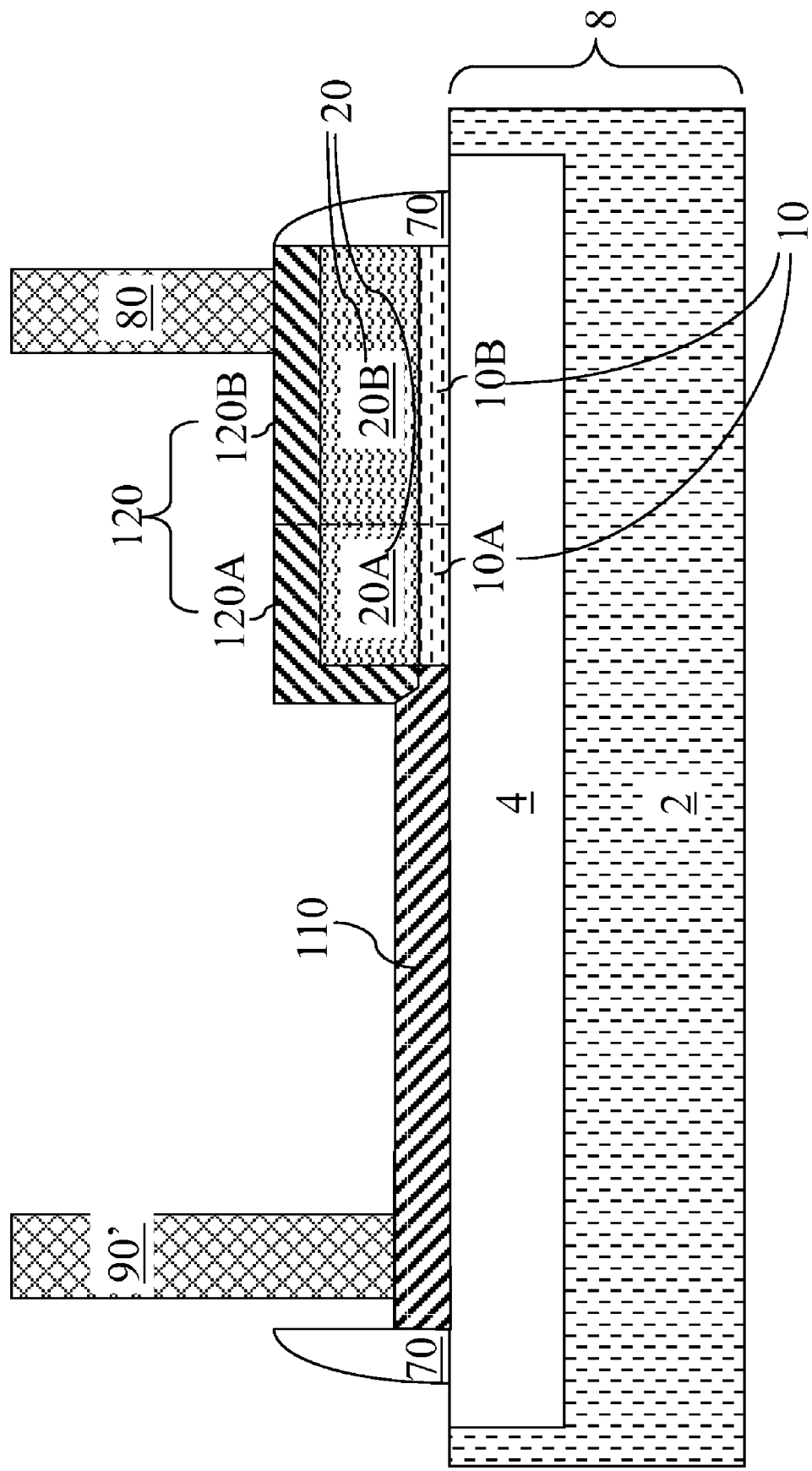

Referring to FIGS. 12A and 12B, a seventh exemplary semiconductor structure according to a seventh embodiment of the present invention is formed in the same manner as the first exemplary semiconductor structure according to the first embodiment. However, the tertiary second semiconductor material sub-portion 20R has the same width as the primary second semiconductor material sub-portion 20P (See FIGS. 2A and 2B). Further, the location of the opening O in the second photoresist 67 (See FIGS. 3A and 3B) is adjusted such that the opening O is located not only over a portion of the primary second semiconductor material sub-portion 20P but also over the entirety of the tertiary second semiconductor material sub-portion 20R (See FIGS. 2A and 2B).

The second metal semiconductor alloy portion 120 comprises the narrow second metal semiconductor alloy sub-portion 120A and the wide second metal semiconductor alloy sub-portion 120B. A second semiconductor stack is not formed in this embodiment. At least one first metal contact via 80 directly contacts the wide second metal semiconductor alloy sub-portion 120B. At least one second metal contact via 90' directly contacts a first metal semiconductor alloy portion 110.

The first metal semiconductor alloy portion 110 has a first width W1. The first semiconductor stack (10, 20) comprises a first narrow region (10A, 20A) having a second width W2 and a first wide region (10B, 20B) having a third width W3. The first narrow region (10A, 20A) laterally abuts the first metal semiconductor alloy portion 110. The first width W1 is the same as the second width W2 and is less than the third width W3. The first width W1, the second width W2, and the third width W3 are measured in a direction parallel to an interface between the first metal semiconductor alloy portion 110 and the first semiconductor portion 10. The direction of the measurement of the various widths is in a horizontal plane. The first width W1 and the second width W2 are the same, and may be a lithographic minimum dimension. Consequently, a diameter of each of the at least one second metal contact via 90' may exceed the first width W1.

Figure 13A:
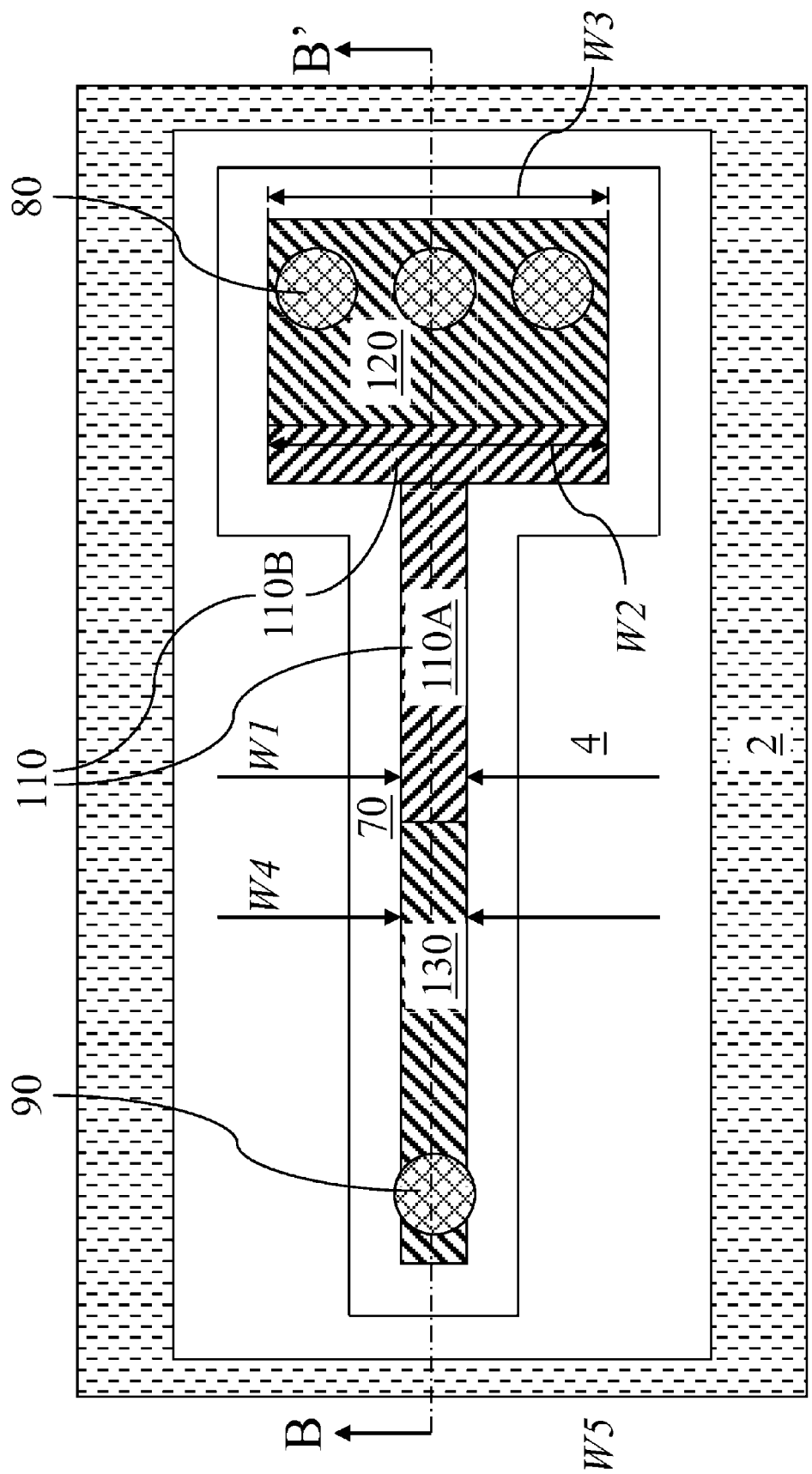
Figure 13B:
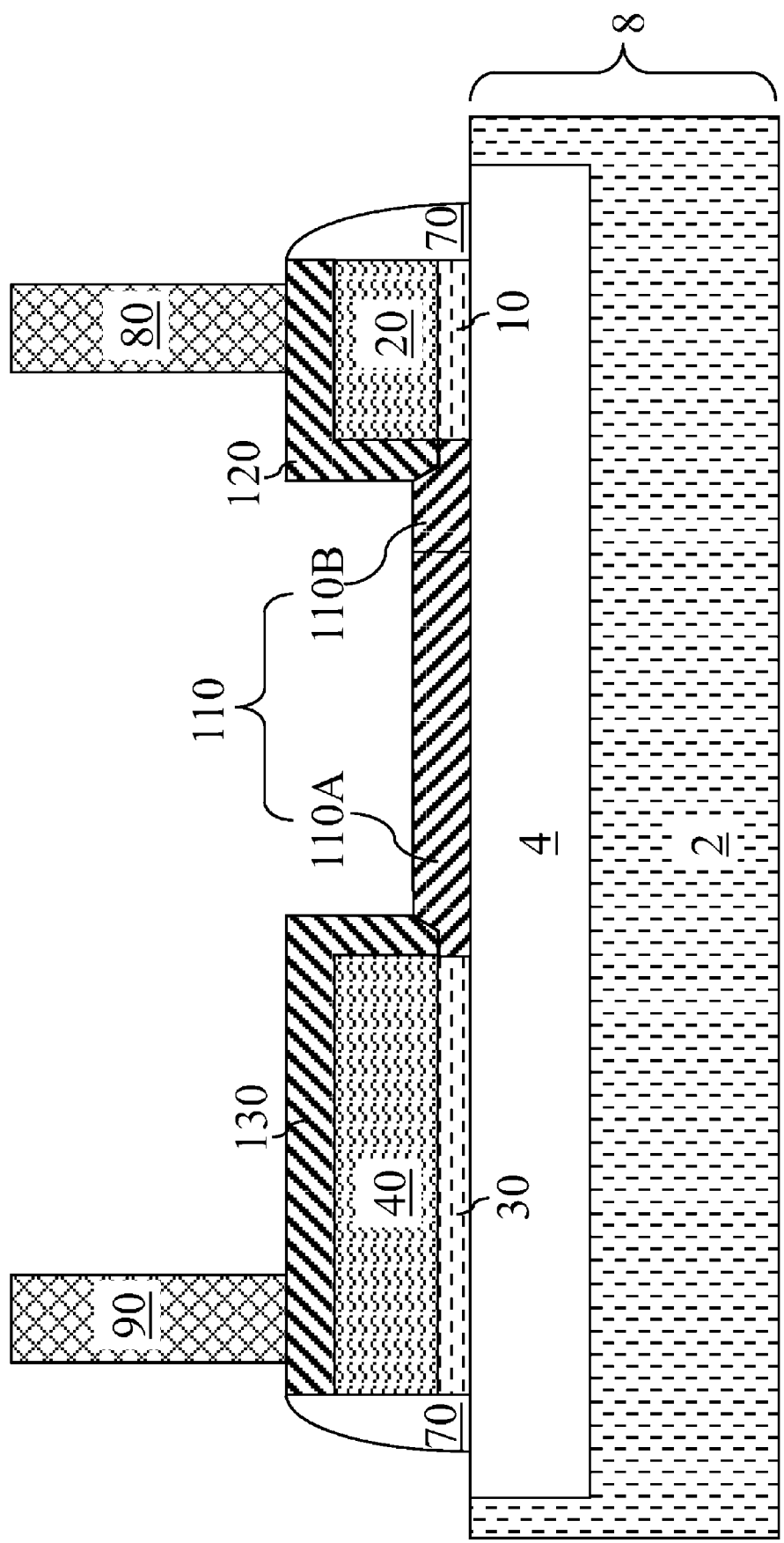

Referring to FIGS. 13A and 13B, an eighth exemplary semiconductor structure according to an eighth embodiment of the present invention is formed in the same manner as the first exemplary semiconductor structure according to the first embodiment. However, the tertiary second semiconductor material sub-portion 20R has the same width as the primary second semiconductor material sub-portion 20P (See FIGS. 2A and 2B). Further, the location of the opening O in the second photoresist 67 (See FIGS. 3A and 3B) is adjusted such that the opening O is located not only over a portion of the primary second semiconductor material sub-portion 20P but also over a portion of the second semiconductor material sub-portion 20Q (See FIGS. 2A and 2B).

A first semiconductor stack (10, 20) comprises a first semiconductor portion 10 and a second semiconductor portion 20. A second semiconductor stack (30, 40) comprises a third semiconductor portion 30 and a fourth semiconductor portion 40. At least one first metal contact via 80 directly contacts a second metal semiconductor alloy portion 120. At least one second metal contact via 90 directly contacts a third metal semiconductor alloy portion 130.

The first metal semiconductor alloy portion 110 comprises a narrow region, which is a narrow first metal semiconductor alloy sub-portion 110A, and a wide region, which is a wide first metal semiconductor alloy sub-portion 110B. The narrow first metal semiconductor alloy sub-portion 110A has a first width W1 and the wide first metal semiconductor alloy sub-portion 110B has a second width W2. The second width W2 is greater than the first width W1. The wide first metal semiconductor alloy sub-portion 110B laterally abuts the first semiconductor stack (10, 20). The first semiconductor stack (10, 20) has a third width W3. The third width W3 is equal to the second width W2. The second semiconductor stack (30, 40) has a fourth width W4. The fourth width W4 is the same as the first width W1. The first width W1, the second width W2, the third width W3, and the fourth width W4 are measured in a direction parallel to an interface between the first metal semiconductor alloy portion 110 and the first semiconductor portion 10, which is also parallel to an interface between the first metal semiconductor alloy portion 110 and the third semiconductor portion 30. The direction of the measurement of the various widths is in a horizontal plane. The first width W1, the second width W2, and the fourth width W4, which are the same among one another, and may be a lithographic minimum dimension. Consequently, a diameter of each of the at least one second metal contact via 90 may exceed the first width W1.

Figure 14A:
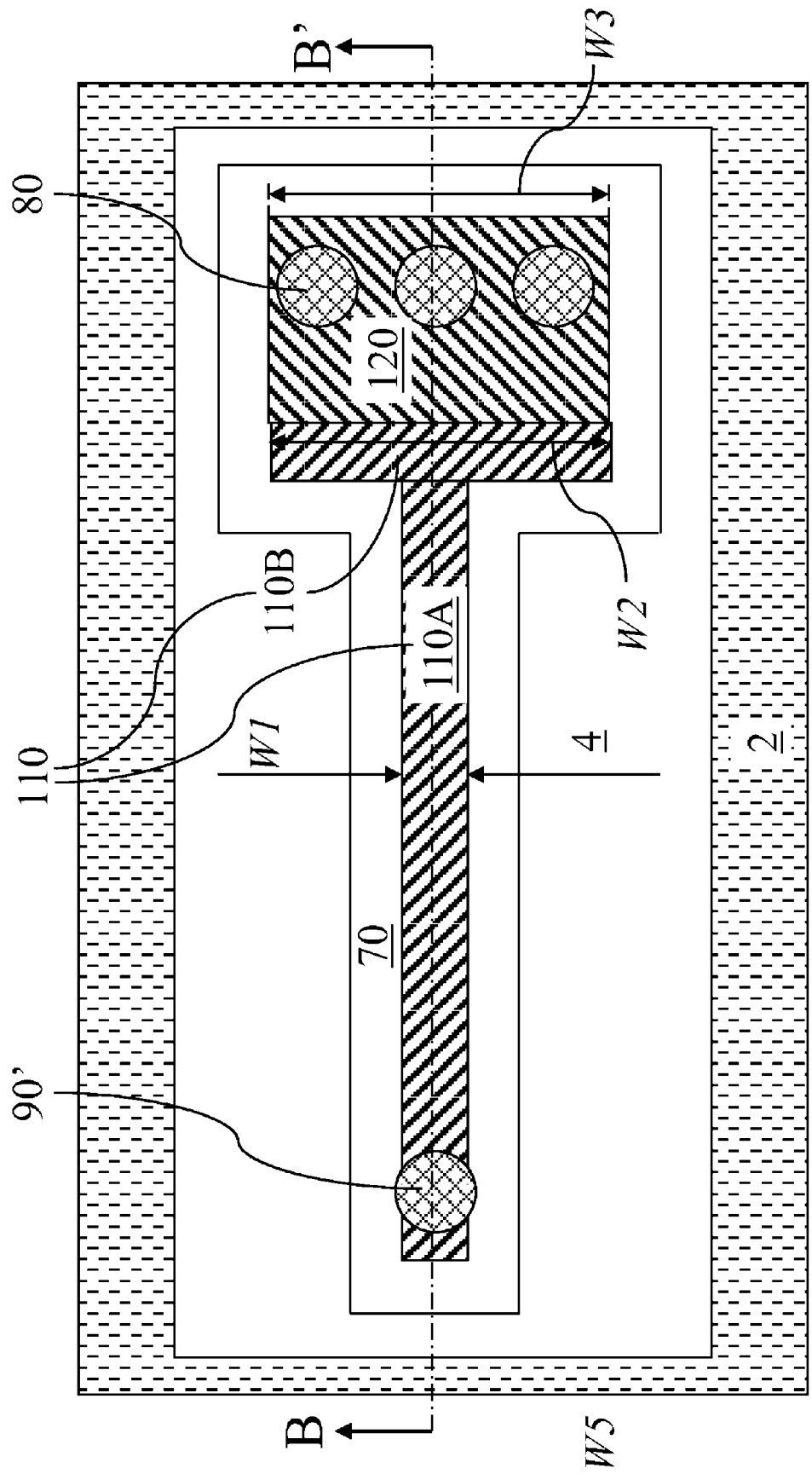
Figure 14B:
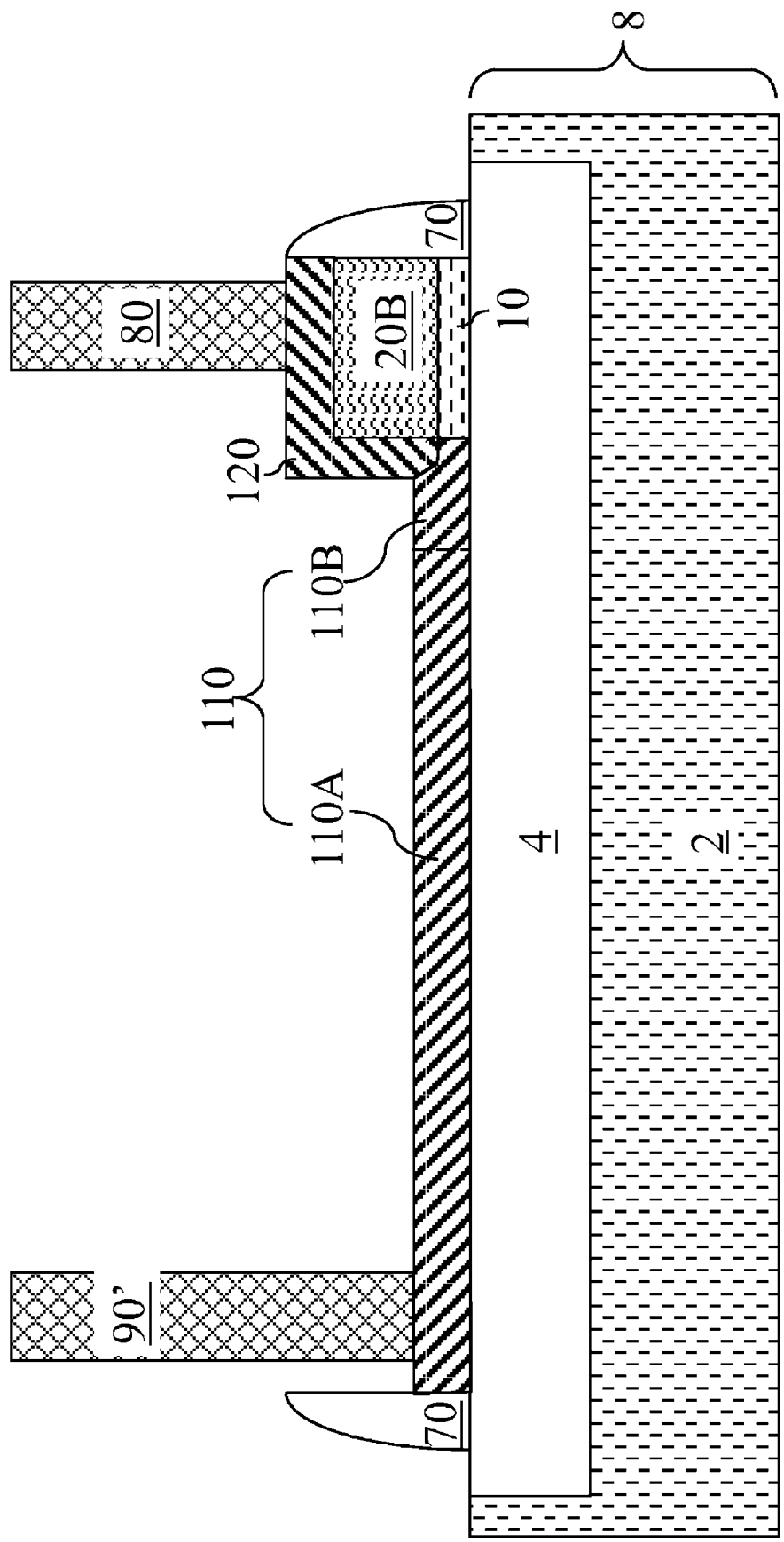

Referring to FIGS. 14A and 14B, a ninth exemplary semiconductor structure according to a ninth embodiment of the present invention is formed in the same manner as the first exemplary semiconductor structure according to the first embodiment. However, the tertiary second semiconductor material sub-portion 20R has the same width as the primary second semiconductor material sub-portion 20P (See FIGS. 2A and 2B). Further, the location of the opening O in the second photoresist 67 (See FIGS. 3A and 3B) is adjusted such that the opening O is located not only over a portion of the primary second semiconductor material sub-portion 20P but also over the entirety of the tertiary second semiconductor material sub-portion 20R and a portion of the secondary second semiconductor material sub-portion 20Q (See FIGS. 2A and 2B).

A first semiconductor stack (10, 20) comprises a first semiconductor portion 10 and a second semiconductor portion 20. A second semiconductor stack is not formed in this embodiment. At least one first metal contact via 80 directly contacts a second metal semiconductor alloy portion 120. At least one second metal contact via 90' directly contacts a first metal semiconductor alloy portion 110.

The first metal semiconductor alloy portion 110 comprises a narrow region, which is a narrow first metal semiconductor alloy sub-portion 110A, and a wide region, which is a wide first metal semiconductor alloy sub-portion 110B. The narrow first metal semiconductor alloy sub-portion 110A has a first width W1 and the wide first metal semiconductor alloy sub-portion 110B has a second width W2. The second width W2 is greater than the first width W1. The wide first metal semiconductor alloy sub-portion 110B laterally abuts the first semiconductor stack (10, 20). The first semiconductor stack (10, 20) has a third width W3. The third width W3 is equal to the second width W2. The first width W1, the second width W2, and the third width W3 are measured in a direction parallel to an interface between the first metal semiconductor alloy portion 110 and the first semiconductor portion 10. The direction of the measurement of the various widths is in a horizontal plane. The first width W1 and the second width W2 are the same, and may be a lithographic minimum dimension. Consequently, a diameter of each of the at least one second metal contact via 90' may exceed the first width W1.

Figure 15A:
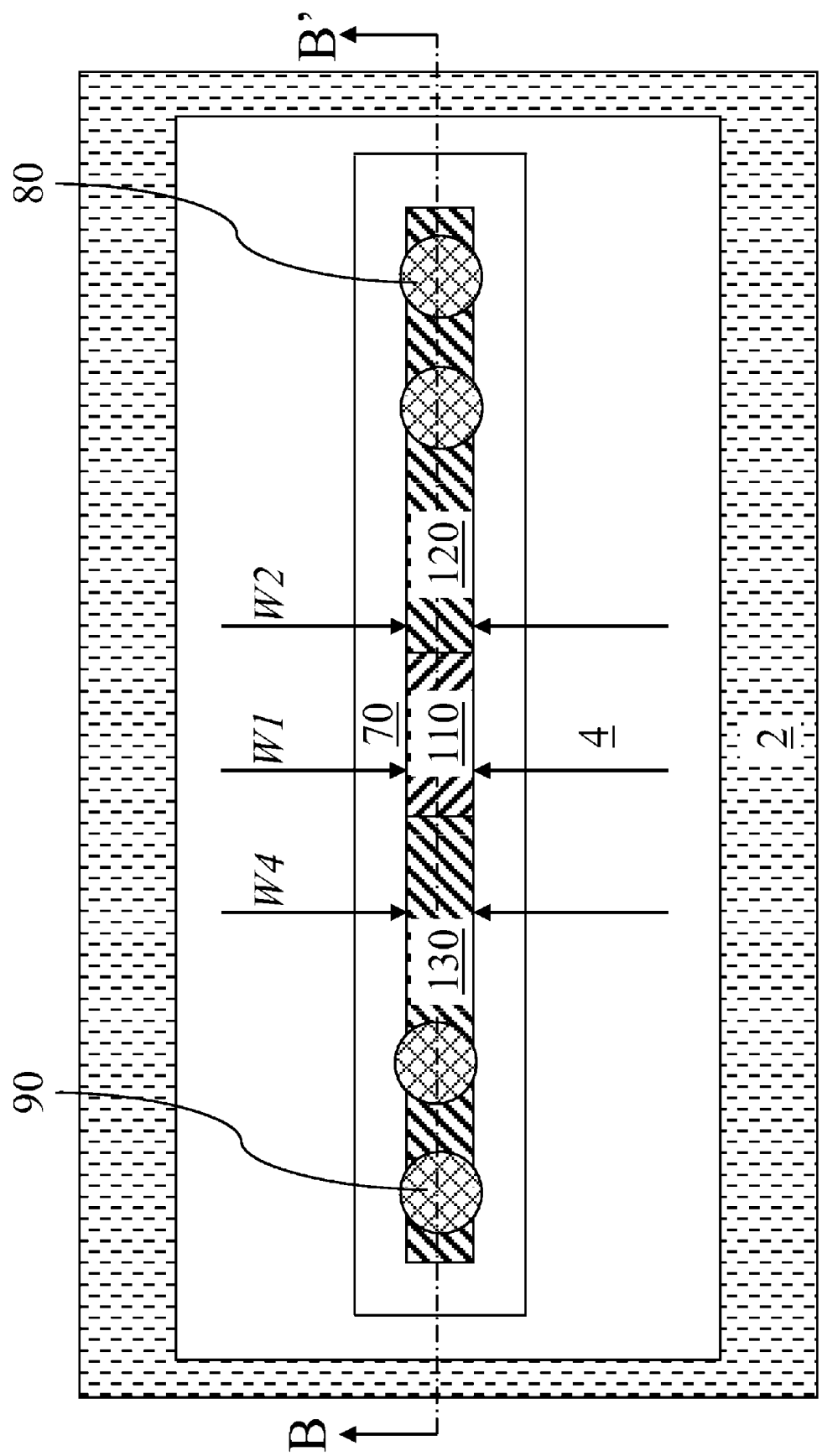
Figure 15B:
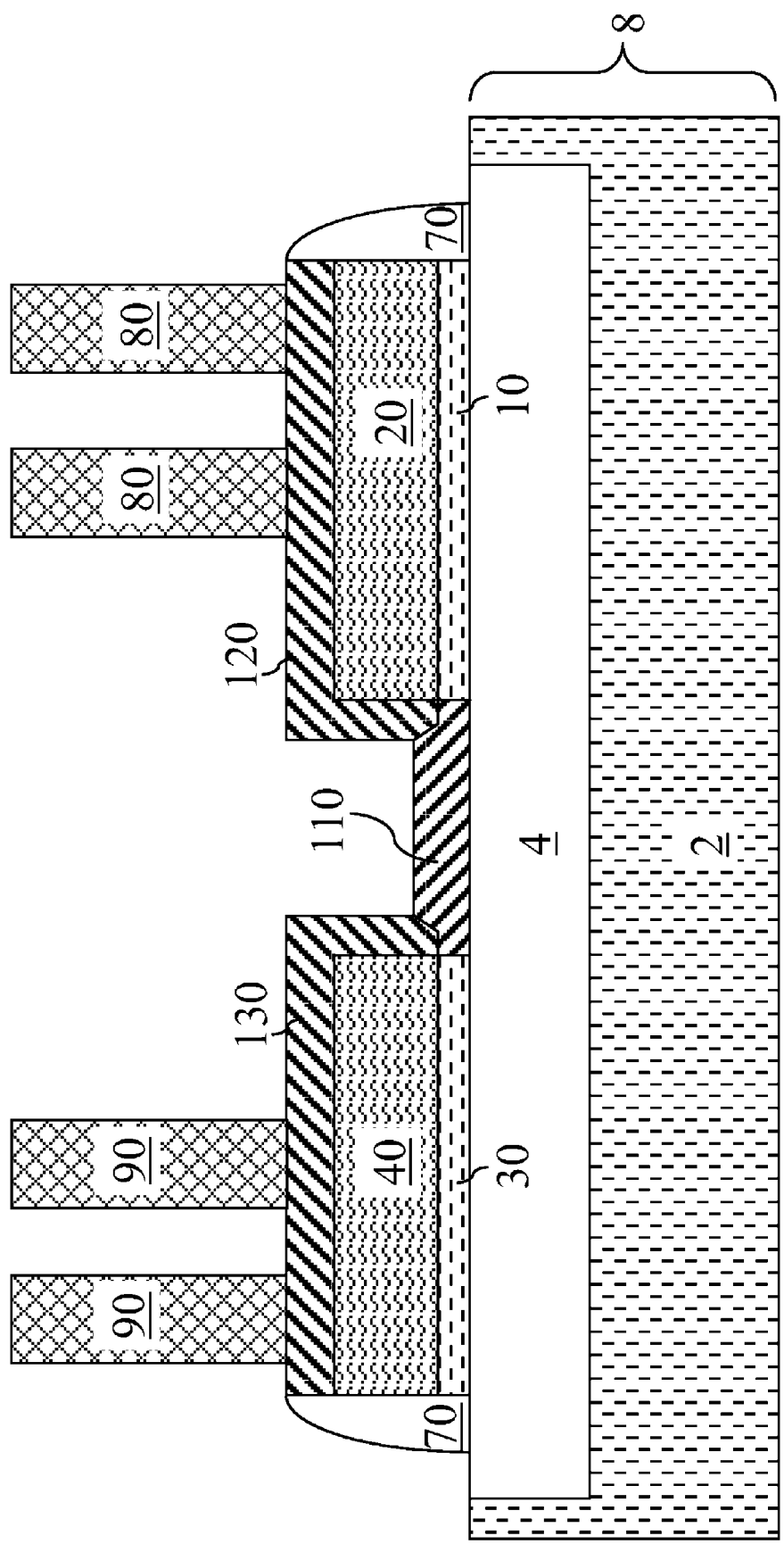

Referring to FIGS. 15A and 15B, a tenth exemplary semiconductor structure according to a tenth embodiment of the present invention is formed in the same manner as the first exemplary semiconductor structure according to the first embodiment. However, the secondary second semiconductor material sub-portion 20Q and tertiary second semiconductor material sub-portion 20R have the same width as the primary second semiconductor material sub-portion 20P (See FIGS. 2A and 2B).

A first semiconductor stack (10, 20) comprises a first semiconductor portion 10 and a second semiconductor portion 20. A second semiconductor stack (30, 40) comprises a third semiconductor portion 30 and a fourth semiconductor portion 40. At least one first metal contact via 80 directly contacts a second metal semiconductor alloy portion 120. At least one second metal contact via 90 directly contacts a third metal semiconductor alloy portion 130.

The first metal semiconductor alloy portion 110 has a first width W1. The first metal semiconductor alloy portion 110 laterally abuts the first semiconductor stack (10, 20). The first semiconductor stack (10, 20) has a second width W2. The second width W2 is equal to the first width W1. The second semiconductor stack (30, 40) has a fourth width W4. The fourth width W4 is the same as the first width W1. The first width W1, the second width W2, and the fourth width W4 are measured in a direction parallel to an interface between the first metal semiconductor alloy portion 110 and the first semiconductor portion 10, which is also parallel to an interface between the first metal semiconductor alloy portion 110 and the third semiconductor portion 30. The direction of the measurement of the various widths is in a horizontal plane. The first width W1, the second width W2, and the fourth width W4, which are the same among one another, and may be a lithographic minimum dimension. Consequently, a diameter of each of the at least one second metal contact via 90 and/or a diameter of each of the at least one first metal contact via 80 may exceed the first width W1.

Figure 16A:
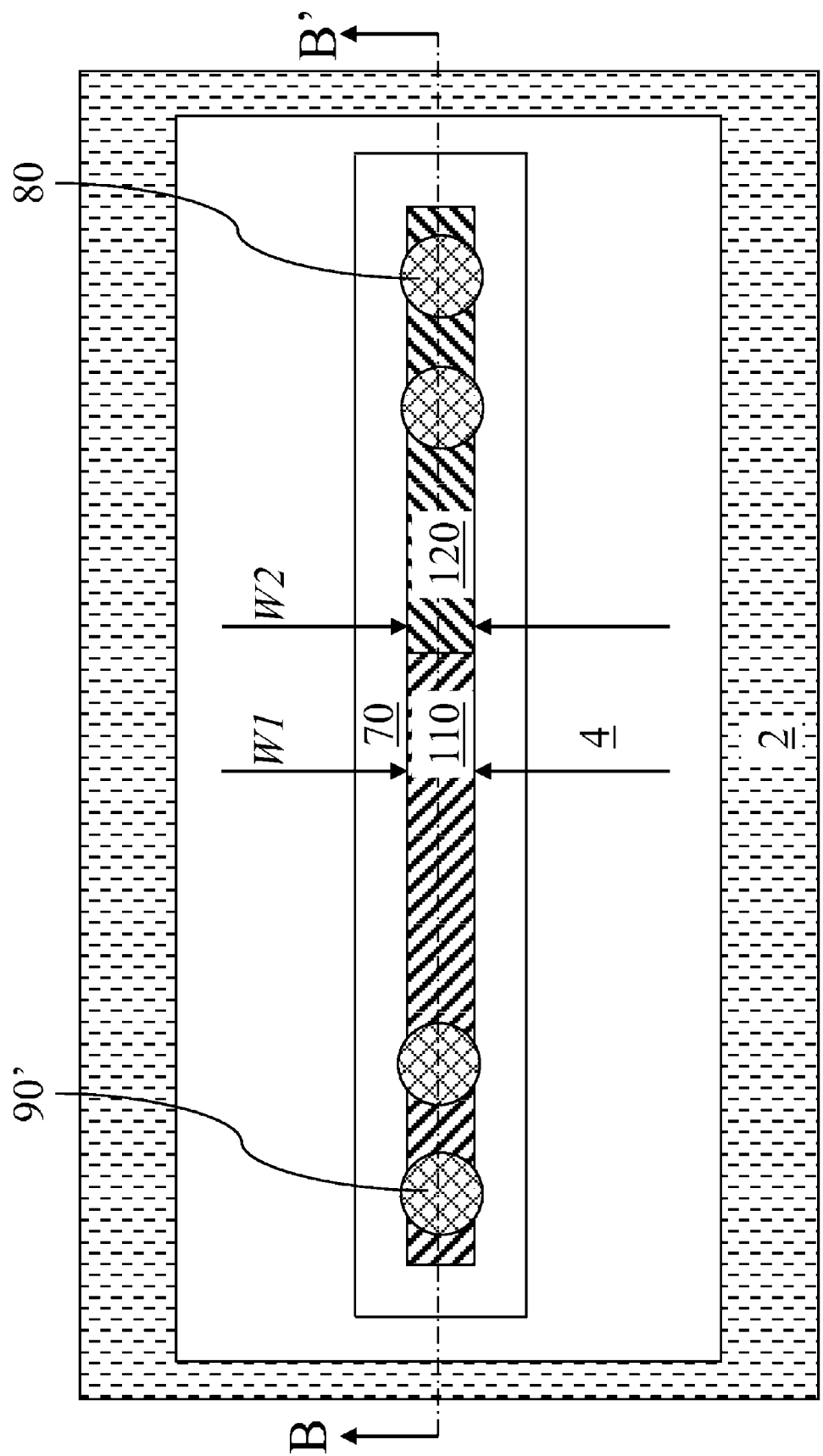
Figure 16B:
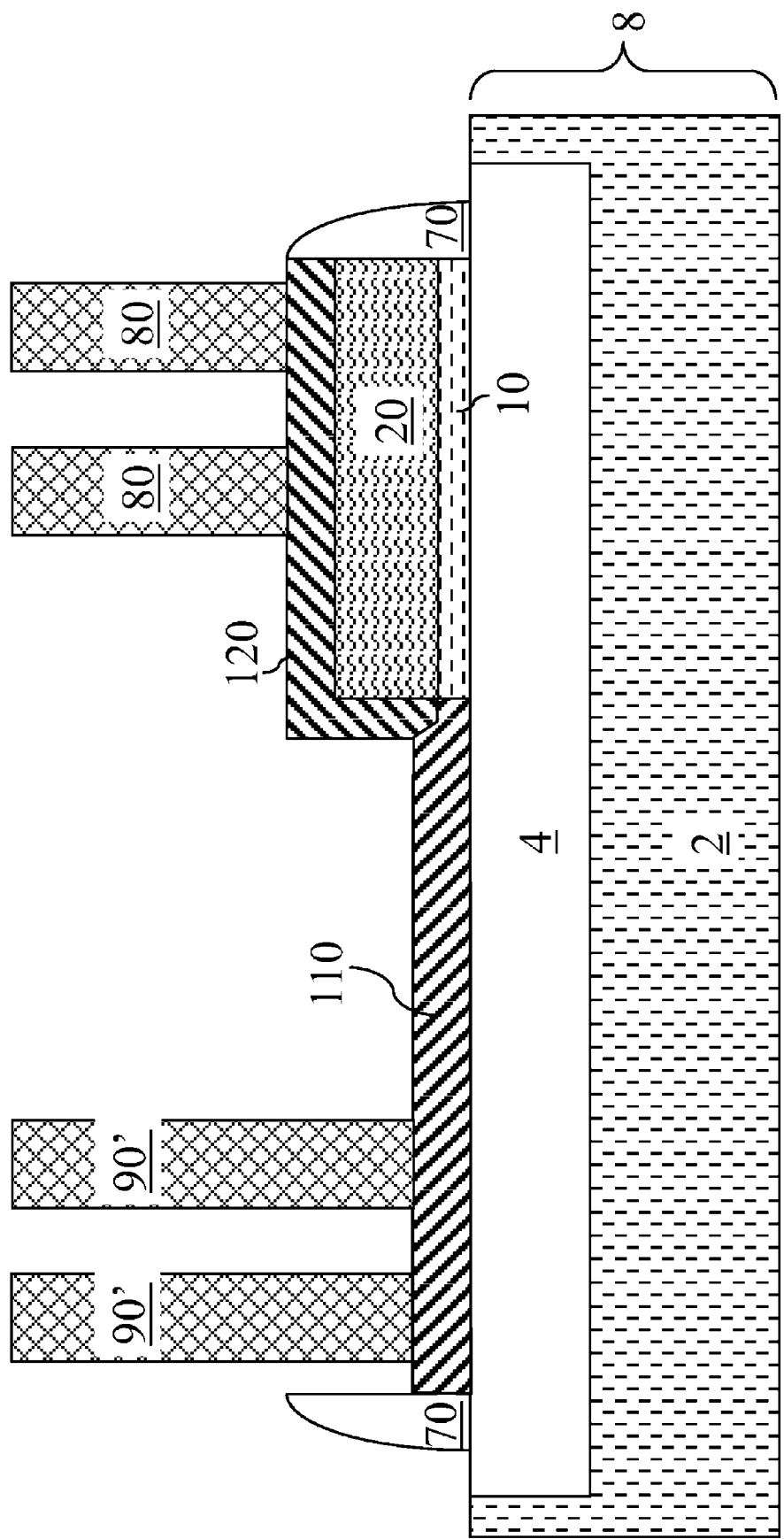

Referring to FIGS. 16A and 16B, an eleventh exemplary semiconductor structure according to an eleventh embodiment of the present invention is formed in the same manner as the first exemplary semiconductor structure according to the first embodiment. However, the secondary second semiconductor material sub-portion 20Q and tertiary second semiconductor material sub-portion 20R have the same width as the primary second semiconductor material sub-portion 20P (See FIGS. 2A and 2B). Further, the location of the opening O in the second photoresist 67 (See FIGS. 3A and 3B) is adjusted such that the opening O is located not only over a portion of the primary second semiconductor material sub-portion 20P but also over the entirety of the tertiary second semiconductor material sub-portion 20R (See FIGS. 2A and 2B).

A first semiconductor stack (10, 20) comprises a first semiconductor portion 10 and a second semiconductor portion 20. A second semiconductor stack is not formed in this embodiment. At least one first metal contact via 80 directly contacts a second metal semiconductor alloy portion 120. At least one second metal contact via 90' directly contacts a first metal semiconductor alloy portion 110.

The first metal semiconductor alloy portion 110 has a first width W1. The first metal semiconductor alloy portion 110 laterally abuts the first semiconductor stack (10, 20). The first semiconductor stack (10, 20) has a second width W2. The second width W2 is equal to the first width W1. The first width W1 and the second width W2 are measured in a direction parallel to an interface between the first metal semiconductor alloy portion 110 and the first semiconductor portion 10. The direction of the measurement of the various widths is in a horizontal plane. The first width W1 and the second width W2 may be a lithographic minimum dimension. Consequently, a diameter of each of the at least one second metal contact via 90' and/or a diameter of each of the at least one first metal contact via 80 may exceed the first width W1.

Figure 17A:
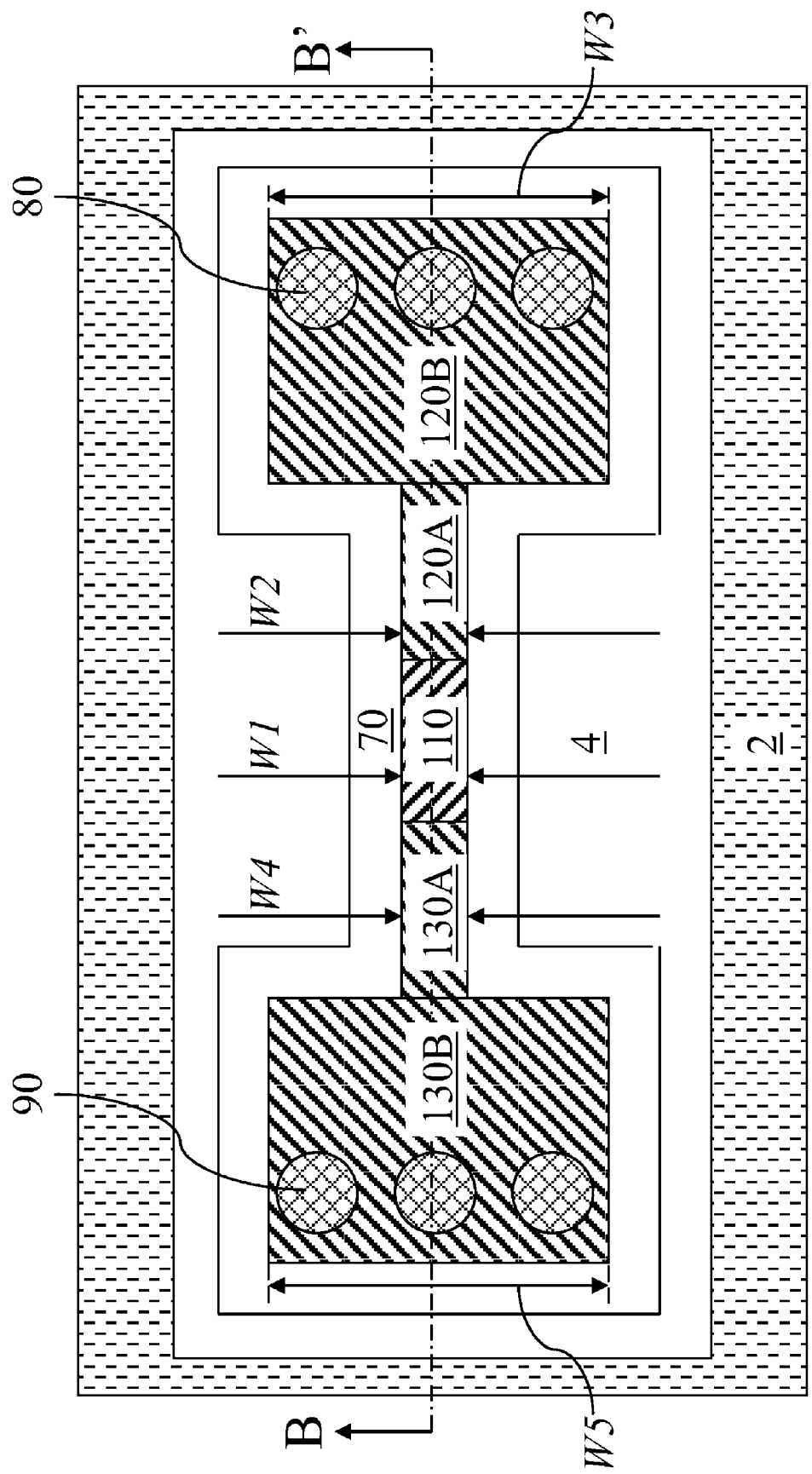
Figure 17B:
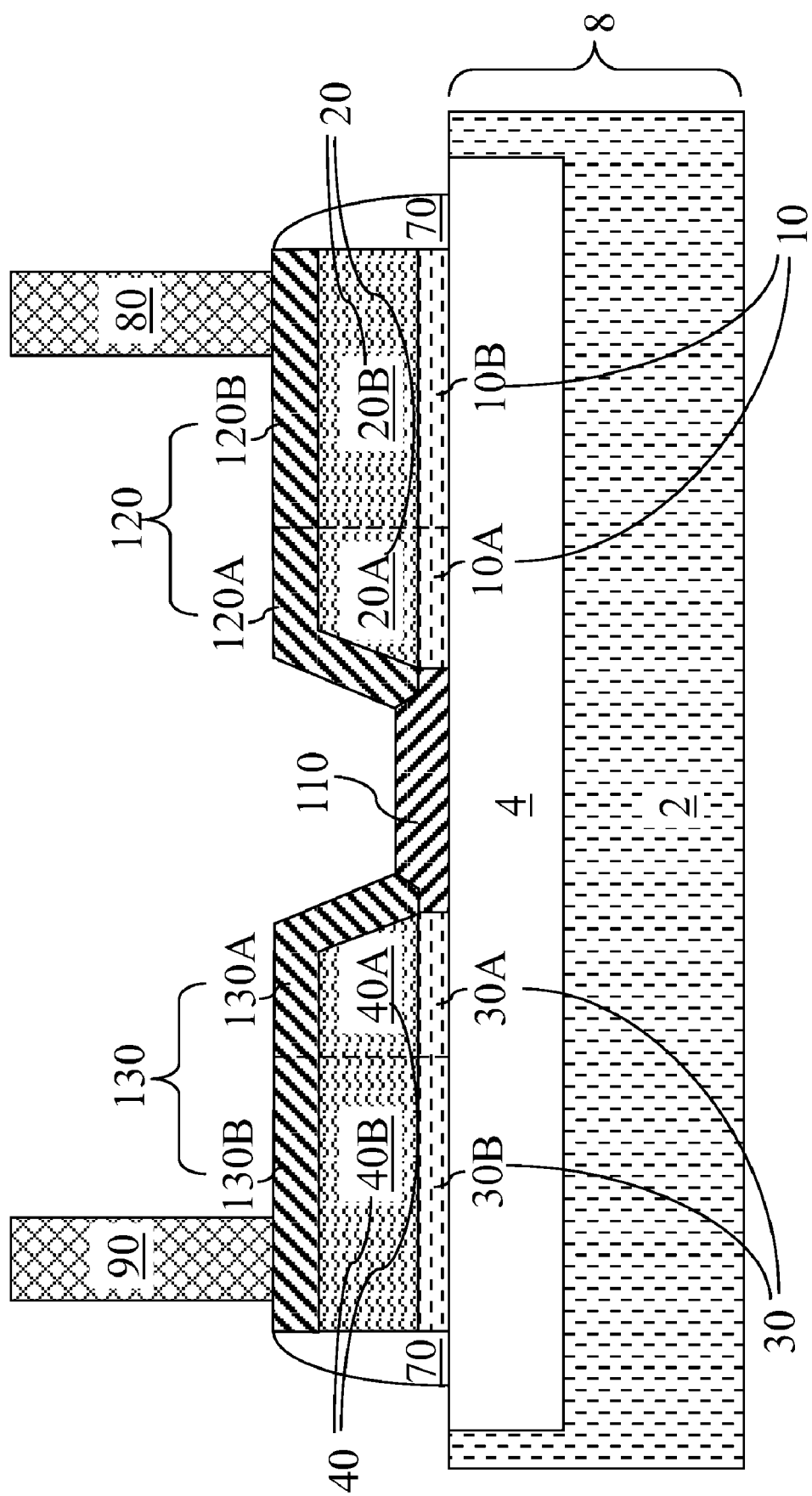

Referring to FIGS. 17A and 17B, a twelfth exemplary semiconductor structure according to a twelfth embodiment of the present invention is formed in the same manner as in the first embodiment. However, lateral etching beneath the second photoresist 67 is performed into the narrow second semiconductor sub-portion 20A and the narrow fourth semiconductor sub-portion 40A during the etch of the exposed portion of the primary second semiconductor material sub-portion 20P (See FIGS. 2A and 2B). This may be effected by introducing an isotropic etch component into the etch process. For example, a partially anisotropic reactive ion etch (RIE) or chemical downstream etch (CDE) may be employed. Alternately, a wet etch may be employed.

The sidewalls of the narrow second semiconductor sub-portion 20A and the narrow fourth semiconductor sub-portion 40A are tapered due to the introduction of the isotropic etch component. Thus, the twelfth exemplary semiconductor structure contains tapered sidewalls of the narrow second semiconductor sub-portion 20A and the narrow fourth semiconductor sub-portion 40A. Further, the narrow second metal semiconductor alloy sub-portion 120A and the narrow third metal semiconductor alloy sub-portion have tapered surfaces.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:

forming a first semiconductor layer comprising a first semiconductor material on an insulator region in a substrate;

forming a second semiconductor layer comprising a second semiconductor material directly on said first semiconductor layer, wherein said second semiconductor material is different from said first semiconductor material;

patterning a contiguous block of containing said first semiconductor layer and said second semiconductor layer;

masking a stack of a first semiconductor portion and a second semiconductor portion, wherein said first semiconductor portion is a portion of said first semiconductor layer and said second semiconductor portion is a portion of said second semiconductor layer, while exposing another portion of said second semiconductor layer;

etching said another portion of said second semiconductor layer to expose a top surface of another portion of said first semiconductor layer, while protecting said stack; and fully metallizing said another portion of said first semiconductor layer to form a first metal semiconductor alloy portion and partially metallizing said second semiconductor portion to form a second metal semiconductor alloy portion, wherein said second metal semiconductor alloy region abuts said first metal semiconductor alloy portion and said second semiconductor portion.

2. The method of claim 1, further comprising forming a dielectric spacer laterally abutting said contiguous block prior to said masking of said masking of said stack of said first semiconductor portion and said second semiconductor portion.

3. The method of claim 1, wherein said first metal semiconductor portion abuts said insulator region, and wherein said second metal semiconductor alloy portion is disjoined from said insulator region and located on a sidewall of said second semiconductor portion.

4. The method of claim 3, wherein said second metal semiconductor alloy portion extends over a top surface of said second semiconductor portion, and wherein said first semiconductor portion and said second semiconductor portion have vertically coincident sidewalls and collectively constitute a first semiconductor stack.

5. The method of claim 4, wherein said first metal semiconductor alloy portion has a first width, wherein said first semiconductor stack comprises a narrow region having a second width and a wide region having a third width, wherein said narrow region laterally abuts said first metal semiconductor alloy portion, wherein said first width is the same as said second width and is less than said third width, and wherein said first width, said second width, and said third width are measured in a direction parallel to an interface between said first metal semiconductor alloy portion and said first semiconductor portion.

6. The method of claim 4, wherein said first metal semiconductor alloy portion comprises a narrow region having a first width and a wide region having a second width, wherein said first semiconductor stack has a third width, wherein said wide region laterally abuts said first semiconductor stack, wherein said first width is the same as said second width and is less than said third width, and wherein said first width, said second width, and said third width are measured in a direction parallel to an interface between said first metal semiconductor alloy portion and said first semiconductor portion.

7. The method of claim 4, wherein said first metal semiconductor alloy portion comprises a narrow region having a first width and a wide region having a second width, wherein said first semiconductor stack has a third width, wherein said narrow region laterally abuts said first semiconductor stack, wherein said first width is the same as said second width and is less than said third width, and wherein said first width, said second width, and said third width are measured in a direction parallel to an interface between said first metal semiconductor alloy portion and said first semiconductor portion.

8. The method of claim 1, further comprising:
  masking another stack of a third semiconductor portion and a fourth semiconductor portion concurrently with said masking of said stack, wherein said third semiconductor portion is a portion of said first semiconductor layer and said fourth semiconductor portion is a portion of said second semiconductor layer;
  protecting said another stack concurrently with said protecting of said stack; and
  partially metallizing said fourth semiconductor portion to form a third metal semiconductor alloy portion concurrently with said fully metallizing of said another portion of said first semiconductor layer, wherein said third metal semiconductor alloy region abuts said first metal semiconductor alloy portion and said fourth semiconductor portion.

9. The method of claim 8, wherein said first semiconductor portion and said second semiconductor portion have a first set of vertically coincident sidewalls and collectively constitute a first semiconductor stack, and wherein said third semiconductor portion and said fourth semiconductor portion have a second set of vertically coincident sidewalls and collectively constitute a second semiconductor stack.

* * * * *